US011984079B2

United States Patent
Lu et al.

(10) Patent No.: US 11,984,079 B2
(45) Date of Patent: May 14, 2024

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yanwei Lu, Beijing (CN); Bangqing Xiao, Beijing (CN); Jianchang Cai, Beijing (CN); Benlian Wang, Beijing (CN); Yao Huang, Beijing (CN); Yue Long, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/018,878

(22) PCT Filed: May 12, 2022

(86) PCT No.: PCT/CN2022/092544
§ 371 (c)(1),
(2) Date: Jan. 31, 2023

(87) PCT Pub. No.: WO2023/142305
PCT Pub. Date: Aug. 3, 2023

(65) Prior Publication Data
US 2024/0071302 A1    Feb. 29, 2024

(30) Foreign Application Priority Data

Jan. 30, 2022    (WO) ................ PCT/CN2022/075242

(51) Int. Cl.
| | |
|---|---|
| G09G 5/00 | (2006.01) |
| G09G 3/3233 | (2016.01) |
| H10K 59/131 | (2023.01) |

(52) U.S. Cl.
CPC ......... *G09G 3/3233* (2013.01); *H10K 59/131* (2023.02); *G09G 2300/0408* (2013.01);
(Continued)

(58) Field of Classification Search
CPC ......... G09G 3/3233; G09G 2300/0233; G09G 2300/0408; G09G 2300/0819;
(Continued)

(56) References Cited

U.S. PATENT DOCUMENTS 11,532,690 B2 * 12/2022 Liu ...................... H10K 59/121
11,737,325 B2 *  8/2023 Yang ...................... H10K 59/88
                                                             257/71
(Continued)

FOREIGN PATENT DOCUMENTS

| CN | 111179828 A | * | 5/2020 | ........... G09G 3/3208 |
| CN | 112186021 A | * | 1/2021 | ........... G09G 3/3225 |
| WO | WO-2022226994 A1 | * | 11/2022 | |

*Primary Examiner* — Joe H Cheng
(74) *Attorney, Agent, or Firm* — XSENSUS LLP

(57) ABSTRACT

Provided is a display panel. The display panel includes: a substrate, at least one row of light-emitting elements disposed on the substrate, a plurality of pixel drive circuits, a plurality of connection lines, and a plurality of compensation portions. A length of a first connection line electrically connected to a first pixel drive circuit is less than a length of a second connection line electrically connected to a second pixel drive circuit. A capacitance of the first connection line is compensated by electrically connecting the compensation portion to the first connection line, and thus a difference between the capacitance of the first connection line and a capacitance of the second connection line is reduced.

20 Claims, 16 Drawing Sheets

(52) U.S. Cl.
CPC .............. *G09G 2300/0819* (2013.01); *G09G 2300/0842* (2013.01); *G09G 2300/0861* (2013.01); *G09G 2320/0233* (2013.01)

(58) Field of Classification Search
CPC ... G09G 2300/0842; G09G 2300/0861; H10K 59/131
See application file for complete search history.

(56) References Cited

U.S. PATENT DOCUMENTS

| | | | |
|---|---|---|---|
| 2022/0199736 A1* | 6/2022 | Wang | H10K 50/81 |
| 2022/0328595 A1* | 10/2022 | Li | H10K 59/131 |
| 2022/0344427 A1* | 10/2022 | Wei | H10K 59/121 |
| 2022/0352292 A1* | 11/2022 | Yang | H10K 59/131 |

* cited by examiner

DISPLAY PANEL AND DISPLAY DEVICE

CROSS-REFERENCE TO RELATED APPLICATIONS

This application is a U.S. national stage of international application No. PCT/CN2022/092544, which claims priority to International Application No. PCT/CN2022/075242, filed on Jan. 30, 2022, and entitled "DISPLAY PANEL AND DISPLAY DEVICE," the content of each of which is herein incorporated by reference in its entirety.

TECHNICAL FIELD

The present disclosure relates to the technical field of displays, and in particular, relates to a display panel and a display device.

BACKGROUND

At present, display devices are typically provided with photo-sensitive sensors such as image sensors to implement a camera function or a biometric function. To increase the screen-to-body ratio of the display device, the image sensor in the display device is arranged underneath the display panel, and the region, directly opposite the image sensor, in the display panel can still display images under the premise of the light-transmissive function.

SUMMARY

Embodiments of the present disclosure provide a display panel and a display device. The technical solutions are as follows.

According to one aspect of the present disclosure, a display panel is provided. The display panel includes:
- a substrate, including a light-transmissive display region and a conventional display region surrounding the light-transmissive display region;
- a plurality of light-emitting elements disposed in the light-transmissive display region, a plurality of pixel drive circuits disposed in the conventional display region, and a plurality of connection lines and a plurality of compensation portions that are disposed on the substrate; wherein the plurality of light-emitting elements are arranged along a first direction; and the plurality of pixel drive circuits are electrically connected to the plurality of light-emitting elements and at least include a first pixel drive circuit and a second pixel drive circuit, wherein the first pixel drive circuit and the second pixel drive circuit are respectively disposed on two sides of the light-transmissive display region in the first direction and are respectively electrically connected to the light-emitting elements by the connection lines, the connection lines including a first connection line and a second connection line, a length of the first connection line electrically connected to the first pixel drive circuit being less than a length of the second connection line electrically connected to the second pixel drive circuit, the compensation portion being electrically connected to the first connection line, and the first connection line and the second connection line being two connection lines in the plurality of connection lines.

Optionally, the plurality of pixel drive circuits include a plurality of columns of pixel drive circuits arranged on the substrate along the first direction, wherein one column of the pixel drive circuits includes a plurality of the pixel drive circuits arranged along a second direction, an included angle between the second direction and the first direction being greater than 0 degree and less than or equal to 90 degrees; and the first pixel drive circuit is disposed in an $n^{th}$ column of the pixel drive circuits disposed on a first side of the light-transmissive display region, and the second pixel drive circuit is disposed in an $n^{th}$ column of the pixel drive circuits disposed on a second side of the light-transmissive display region, wherein the first side and the second side are the two sides of the light-transmissive display region in the first direction, n is an integer being greater than or equal to 1.

Optionally, the compensation portion includes a linear compensation portion, wherein the linear compensation portion is disposed in the conventional display region.

Optionally, a shape of the linear compensation portion includes at least one of a straight line, an S-shaped winding line, a spiral winding line, and a broken line.

Optionally, the compensation portion includes a block compensation portion, wherein the block compensation portion is disposed in the conventional display region.

Optionally, a shape of the block compensation portion includes at least one of a rectangle, a triangle, a diamond, a circle, and a hexagon.

Optionally, the compensation portion includes a linear compensation portion and a block compensation portion, wherein the linear compensation portion and the block compensation portion are disposed in the conventional display region.

Optionally, one end of the linear compensation portion is connected to the first connection line, and another end of the linear compensation portion is connected to the block compensation portion.

Optionally, the connection line and the compensation portion are disposed in a same layer.

Optionally, the compensation portion is disposed on an end, distal from the light-transmissive display region, of the first connection line.

Optionally, the plurality of connection lines include a third connection line and a fourth connection line, wherein the third connection line and the fourth connection line are disposed in different layers; wherein
    the third connection line is connected to the compensation portion, an orthographic projection of the fourth connection line onto the substrate being at least partially overlapped with an orthographic projection of the compensation portion connected to the third connection line onto the substrate.

Optionally, the plurality of connection lines include a third connection line and a fourth connection line, wherein the third connection line and the fourth connection line are disposed in different layers; wherein
    the third connection line is connected to the compensation portion, an orthographic projection of the fourth connection line onto the substrate being staggered from an orthographic projection of the compensation portion connected to the third connection line onto the substrate.

Optionally, the connection lines include a first sub-connection line and a second sub-connection line that are electrically connected, wherein an end of the first sub-connection line is electrically connected to the light-emitting element, another end of the first sub-connection line is electrically connected to an end of the second sub-connection line, and another end of the second sub-connection line is electrically connected to the pixel drive circuit; wherein
the first sub-connection line extends along the first direction, a plurality of the first sub-connection lines are arranged along a second direction, the compensation portion is connected to the second sub-connection line, and the compensation portion and the first sub-connection line are successively arranged along the second direction, an included angle between the second direction and the first direction being greater than 0 degree and less than or equal to 90 degrees.

Optionally, the plurality of connection lines further include a fifth connection line, wherein the third connection line, the fourth connection line, and the fifth connection line are disposed in different layers, and the third connection line, the fourth connection line, and the fifth connection line are stacked along a direction away from the substrate; wherein
an orthographic projection of at least a portion, extending along the first direction, of the third connection line onto the substrate is at least partially overlapped with an orthographic projection of at least a portion, extending along the first direction, of the fourth connection line onto the substrate, and the orthographic projection of at least the portion, extending along the first direction, of the fourth connection line onto the substrate is not overlapped with an orthographic projection of at least a portion, extending along the first direction, of the fifth connection line onto the substrate.

Optionally, the display panel further includes a planarization layer provided with a plurality of planarization layer via holes; wherein
an orthographic projection of the compensation portion on the substrate is at least partially overlapped with an orthographic projection of at least one of the plurality of planarization layer via holes onto the substrate.

Optionally, the linear compensation portion includes a first linear compensation portion and a second linear compensation portion, wherein the first linear compensation portion is disposed on a side, proximal to a center of the light-transmissive display region, of the second linear compensation portion, and a width of the first linear compensation portion is less than a width of the second linear compensation portion.

Optionally, an absolute value of a difference between a sum of a capacitance of the compensation portion and a capacitance of the first connection line and a capacitance of the second connection line is less than a preset value.

Optionally, the plurality of light-emitting elements include at least one row of the light-emitting elements, wherein the one row of the light-emitting elements includes a plurality of light-emitting element groups, the first direction being parallel to a row direction of the one row of the light-emitting elements.

Optionally, the light-emitting element group includes at least two first light-emitting elements and at least two second light-emitting elements; and
in the plurality of light-emitting elements groups in the one row of the light-emitting elements, the pixel drive circuit electrically connected to the first light-emitting element is disposed on a side, proximal to the light-transmissive display region, of the pixel drive circuit electrically connected to the second light-emitting element.

Optionally, the first light-emitting element and the second light-emitting element are alternately arranged in the first direction.

Optionally, the plurality of light-emitting element groups include a first light-emitting element group and a second light-emitting element group, wherein the plurality of first connection lines are electrically connected to a plurality of light-emitting elements in the first light-emitting element group and a plurality of the first pixel drive circuits, and the plurality of second connection lines are electrically connected to a plurality of light-emitting elements in the second light-emitting element group and a plurality of the second pixel drive circuits;
a length of the first connection line is less than a length of the second connection line, and the compensation portion is connected to at least a portion of the first connection lines; and
the first light-emitting element group includes a first-color light-emitting element, a second-color light-emitting element, and a third-color light-emitting element, wherein at least a portion of the connection lines electrically connected to the first-color light-emitting element and the second-color light-emitting element is connected to the compensation portion.

Optionally, the light-transmissive display region includes two light-transmissive sub-regions arranged along the first direction, wherein the light-emitting element within any light-transmission sub-region in the two light-transmissive sub-regions is electrically connected to the pixel drive circuit in the conventional display region adjacent to the light-transmission sub-region.

Optionally, an area of the compensation portion connected to the first connection line is positively correlated with a first difference, wherein the first difference is a difference between the length of the first connection line and the length of the second connection line.

Optionally, the connection line includes a metal connection line; wherein
the metal connection line is electrically connected to a first light-emitting element nearest an edge of the light-transmissive display region in a row of the light-emitting elements.

Optionally, the pixel drive circuit includes a thin-film transistor, wherein the thin-film transistor includes a source electrode and a drain electrode, wherein the metal connection line and the source electrode and the drain electrode are disposed in a same layer.

Optionally, the display panel further includes, a plurality of conventional pixel drive circuits and a plurality of conventional light-emitting elements that are disposed in the conventional display region, wherein the plurality of conventional pixel drive circuits and the plurality of conventional light-emitting elements that are disposed in the conventional display region are electrically connected in one-to-one correspondence; wherein
an arrangement density of the plurality of conventional light-emitting elements in the conventional display region is equal to an arrangement density of the plurality of light-emitting elements in the light-transmissive display region.

Optionally, the first light-emitting element includes a green light-emitting element, and the at least two second light-emitting elements include a blue light-emitting element and a red light-emitting element.

Optionally, the compensation portion is connected to the connection line electrically connected to at least a portion of the blue light-emitting elements and the red light-emitting elements.

According to another aspect of the present disclosure, a display device is provided. The display device includes a photo-sensitive sensor and the display panel as described above. An orthographic projection of an incident surface of the photo-sensitive sensor onto the substrate of the display panel falls within the light-transmissive display region.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

For some specific embodiments of the present disclosure illustrated by the above drawings, detailed description is given hereafter. Drawings and description are not intended to limit the scope of the conception of the present disclosure, but only to illustrate the concept of the present disclosure for those skilled in the art by referring to the specific embodiments.

DETAILED DESCRIPTION

The present disclosure is described in further detail with reference to the enclosed drawings, to clearly present the objects, technical solutions, and advantages of the present disclosure.

To improve a screen-to-body ratio of a display device, a display panel in the display device is designed to be partially transmissive. Exemplarily, the display panel includes: a light-transmissive display region and a conventional display region disposed outside the light-transmissive display region. The light-transmissive display region is referred to as a full display with camera region (FDC). Light-emitting elements are provided in both the conventional display region and the light-transmissive display region, such that the conventional display region and the light-transmissive display region are both capable of displaying images.

During the manufacturing process of the display panel, more pixel drive circuits are arranged in the conventional display region by compressing, in a row direction, the pixel drive circuits arranged in arrays in the conventional display region. Excessive pixel drive circuits are electrically connected to the light-emitting elements in the light-transmissive display region to drive the light-emitting elements in the light-transmissive display region.

Figure 1:
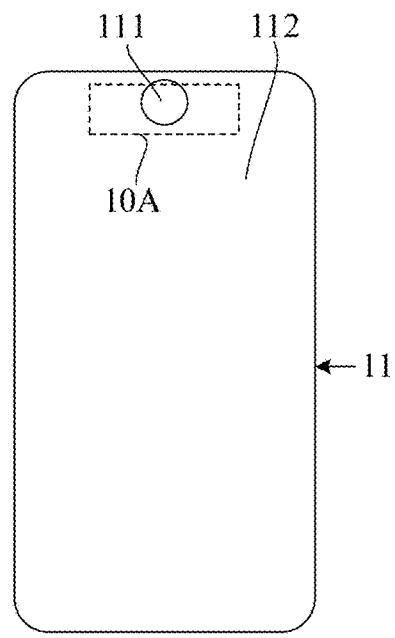
FIG. 1 is a structural schematic diagram of a display panel.
Figure 2:
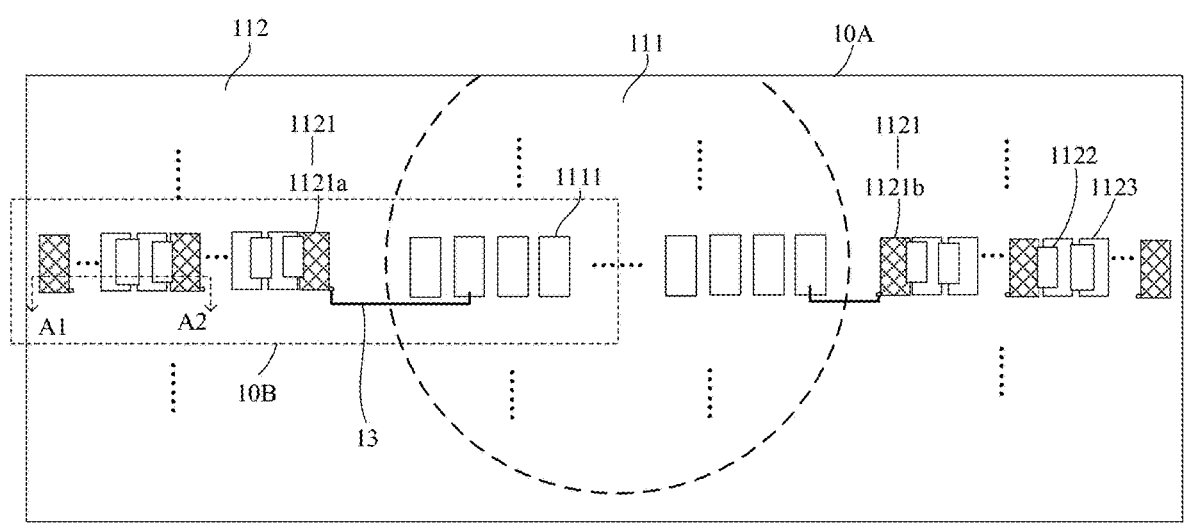
FIG. 2 is a partial structural schematic diagram of the display panel shown in FIG. 1.
Figure 3:
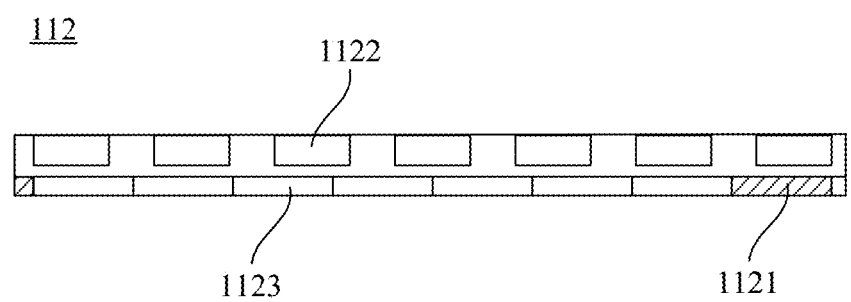
FIG. 3 is a cross-section view of the display panel along an A1-A2 line shown in FIG. 2.
Figure 4:
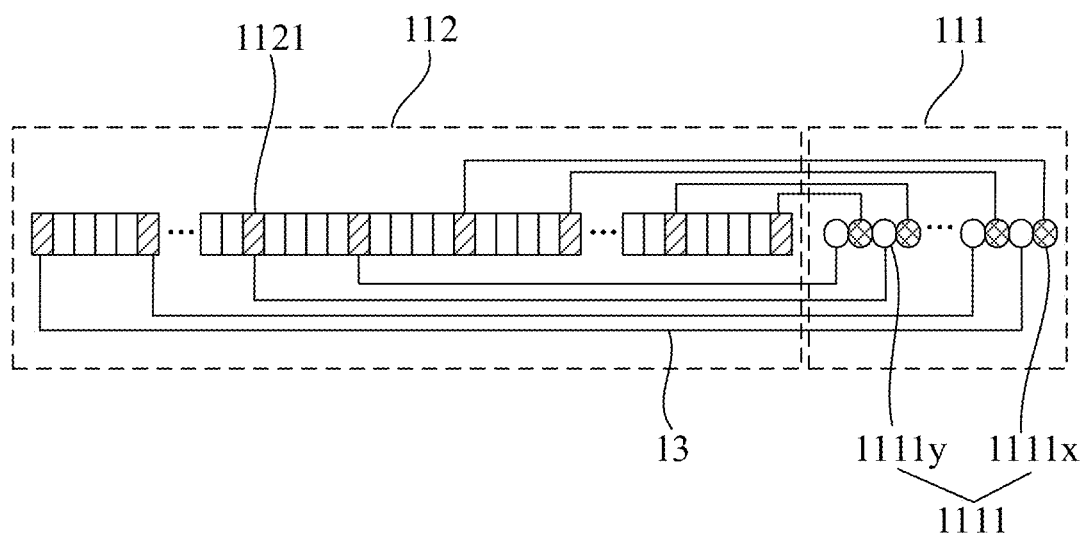
FIG. 4 is a partial structural schematic diagram of a portion 10B in the display panel shown in FIG. 2.

Referring to FIG. 1, FIG. 2, and FIG. 3. FIG. 1 is a structural schematic diagram of a display panel, FIG. 2 is a partial structural schematic diagram of the display panel shown in FIG. 1, FIG. 3 is a cross-section view of the display panel along an A1-A2 line shown in FIG. 2, and FIG. 4 is a partial structural schematic diagram of a portion 10B in the display panel shown in FIG. 2. The display panel includes a substrate 11, and the substrate 11 includes a light-transmissive display region 111 and a conventional display region 112 that is not transmissive.

A plurality of light-emitting elements 1111 are arranged in the light-transmissive display region 111, and a plurality of pixel drive circuits 1121 electrically connected to the light-emitting elements 1111 of the light-transmissive display region 111 are arranged in the conventional display region 112. The plurality of pixel drive circuits 1121 are respectively disposed on two sides of the light-transmissive display region 111, such that a length of a connection line between the light-emitting element 1111 in the light-transmissive display region 111 and the pixel drive circuit 1121 electrically connected to the light-transmissive display region 111 is short.

Each of the light-emitting elements 1111 in the light-transmissive display region 111 and the corresponding electrically connected pixel drive circuit 1121 in the conventional display region 112 in the same row constitute the first pixel unit. The conventional display region 112 includes the plurality of pixel drive circuits 1121, and further includes a plurality of second pixel units. A 10A pixel unit in the conventional display region 112 includes a light-emitting element 1122 and a pixel drive circuit 1123.

Exemplarily, referring to FIG. 3, in the row direction of the pixel drive circuits 1121, a plurality of pixel drive circuits 1123 are spaced apart between any two pixel drive circuits 1121 in one row of second pixel drive circuits 1121.

It should be noted that, during the manufacturing process of the display panel, reducing the size, in the row direction, of the pixel drive circuits in the conventional display region 112 while maintaining the size, in the column direction, of the pixel drive circuits is equivalent to compressing sizes, in the column direction, of the pixel drive circuits 1121 and the pixel drive circuits 1123 without changing the position and the structure of the light-emitting element 1122. In this way, more columns of the pixel drive circuits are arranged in the unit area of the substrate, and the light-emitting element 1122 in the conventional display region 112 is connected to a corresponding pixel drive circuit 1123 in the conventional display region 112, such that a normal display of the light-emitting element 1122 disposed at an original position is ensured. In the compressed pixel circuit, a pixel drive circuit not connected to the light-emitting element 1122 is electrically connected to the light-emitting element 11111 in the light-transmissive display region 111 by the connection line 13.

Referring to FIG. 4, the plurality of light-emitting elements 1111 disposed in the light-transmissive display region 111 are provided with a variety of light-emitting elements 1111, and colors of the variety of light-emitting elements 1111 are different. In a process of electrically connecting the variety of light-emitting elements 1111 to the pixel drive circuits 1121 disposed in the conventional display region 112, due to different start voltages of different types of light-emitting elements, a certain type of light-emitting element exists, which is referred to as a first light-emitting element 1111x, and as a length of the connection line 13 becomes longer, the type of light-emitting element 1111x is not capable of starting or a start time is too long. Therefore, the first light-emitting element 1111x of this type is electrically connected to the pixel drive circuit 1121 which is close to the light-transmissive display region 112 first, such that the first light-emitting element 1111x is started easily, and then second light-emitting elements 1111y of other types are electrically connected to the pixel drive circuits 1121 which are distant from the light-transmissive display region 112.

In the case a drive current emitted by the pixel drive circuit intends to drive the light-emitting element, the connection line is charged first, and then the light-emitting element is activated. That is, the activation of the light-emitting element is not instantaneous and there is an activation process. Exemplarily, the activation time refers to the duration from a moment that the pixel drive circuit emits the drive current to the moment that the light-emitting element is lit up.

Figure 5:
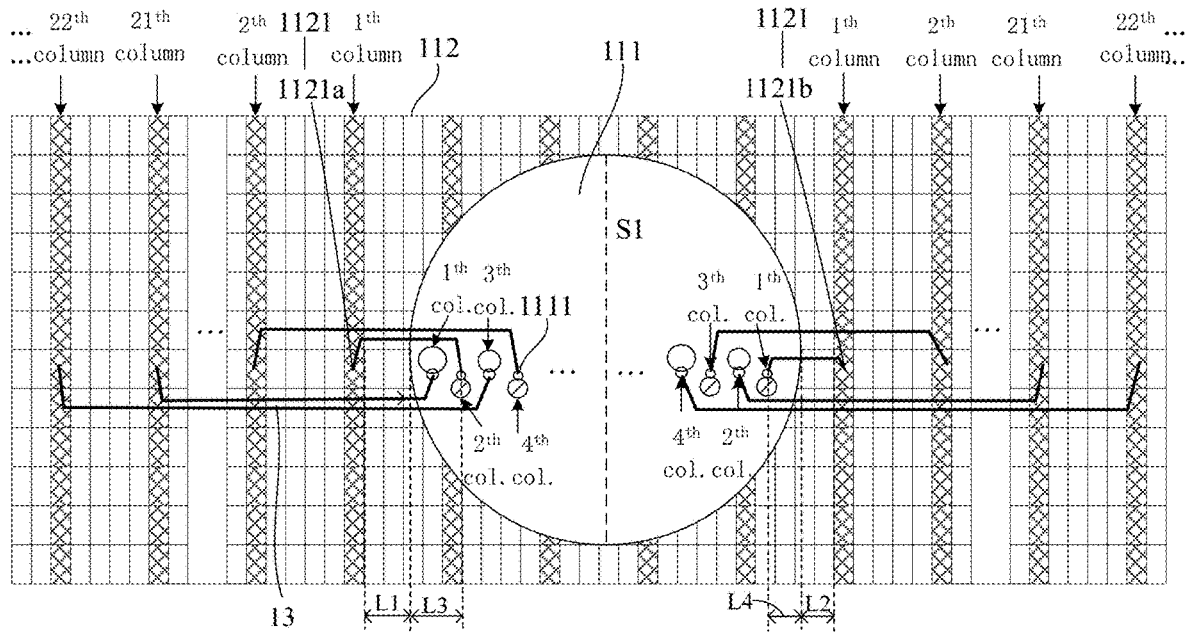
FIG. 5 is a structural schematic diagram of a pixel drive circuit connected to a light-emitting element.
Figure 6:
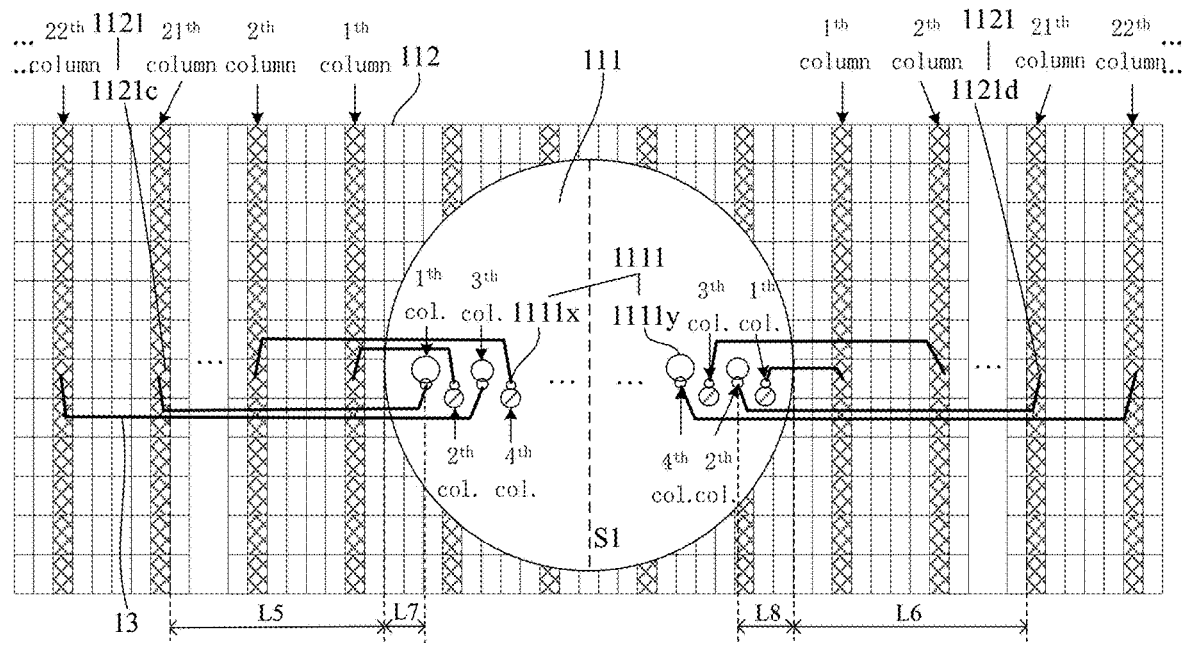
FIG. 6 is a structural schematic diagram of a pixel drive circuit connected to a light-emitting element.

FIG. 5 is a structural schematic diagram of a pixel drive circuit connected to a light-emitting element. FIG. 6 is a structural schematic diagram of a pixel drive circuit connected to a light-emitting element. The position of the light-transmissive display region 111 on the substrate is not fixed, and the distance between the light-emitting element 1111 in the light-transmissive display region 111 and the electrically connected pixel drive circuit 1121 varies in the case that the light-transmissive display region 111 is disposed at different positions on the substrate. Exemplarily, as shown in FIGS. 2 and 5, the pixel drive circuits 1121 disposed on the two sides of the light-transmissive display region 111 include a first pixel drive circuit 1121a and a second pixel drive circuit 1121b, and positions of the first pixel drive circuit 1121a and the second pixel drive circuit 1121b are symmetrical with respect to the position of the light-transmissive display region 111. It should be noted that, the term "symmetry" in the embodiments of the present disclosure includes a case where distances between two pixel drive circuits (the first pixel drive circuit 1121a and the second pixel drive circuit 1121b) and the light-transmissive display region 111 are the same, and further includes a case where the two pixel drive circuits 1121 are disposed in the same column. That is, as shown in FIG. 5, in a case where the two pixel drive circuits (the first pixel drive circuit 1121a and the second pixel drive circuit 1121b) are both a first column of pixel drive circuit along the center of the light-transmissive display region 111 away from the light-transmissive display region 111, and a case where the two pixel drive circuits (the first pixel drive circuit 1121a and the second pixel drive circuit 1121b) are both a second column of pixel drive circuits along the direction away from the light-transmissive display region 111, the two pixel drive circuits 1121 are also considered as "symmetrical" pixel drive circuits 1121. In FIG. 5, the distance between the first pixel drive circuit 1121a and the light-transmissive display region 111 is L1, the distance between the second pixel drive circuit 1121b and the light-transmissive display region 111 is L2, and L1 is equal to L2. The first pixel drive circuit 1121a and the second pixel drive circuit 1121b are correspondingly electrically connected to light-emitting elements 1111 of the same type. However, the variety of light-emitting elements 1111 disposed in the light-transmissive display region 111 are arranged in a certain order, and therefore, a distance L3 between the light-emitting element 1111 electrically connected to the first pixel drive circuit 1121a and an edge of the light-transmissive display region 111 is longer than a distance L4 between the light-emitting element 1111 electrically connected to the second pixel drive circuit 1121b and the edge of the light-transmissive display region 111, such that lengths of the connection lines 13 electrically connected to the first pixel rive circuit 1121a and the second pixel drive circuit 1121b are different.

Alternatively, as shown in figures, the distances between the light-transmissive display region 111 and the pixel drive circuits 1121 disposed on the two sides of the light-transmissive display region are different. That is, the light-transmissive display region 111 is closer to the pixel drive circuit 1121 disposed on the left side of the light-transmissive display region 111 and further from the pixel drive circuit disposed on the right side of the light-transmissive display region 111. The light-transmissive display region has a symmetry axis S1, an extension direction of which is perpendicular to extension directions of the plurality of connection lines 13. The light-transmissive display region 111 has a first side disposed on one side of the symmetry axis SL and further has a second side disposed on the other side of the symmetry axis SL. The first side is the left side, and the second side is the right side. Exemplarily, the pixel drive circuits 1121 include a third pixel drive circuit 1121c disposed in the third column of the left side of the light-transmissive display region and a fourth pixel drive circuit 1121d disposed in the third column of the right side of the light-transmissive display region. The third pixel drive circuit 1121c and the fourth pixel drive circuit 1121d are correspondingly electrically connected to the light-emitting elements 1111 of the same type. In FIG. 6, the distance between the third pixel drive circuit 1121c and the light-transmissive display region 111 is L5, and the distance between the fourth pixel drive circuit 1121d and the light-transmissive display region 111 is L6. L5 is less than L6. Moreover, the variety of light-emitting elements 1111 in the light-transmissive display region 111 are arranged in the certain order, and therefore, a distance L7 between the light-emitting element 1111 electrically connected to the third pixel drive circuit 1121c and the edge of the light-transmissive display region 111 is shorter than a distance L8 between the light-emitting element 1111 electrically connected to the fourth pixel drive circuit 1121d and the edge of the light-transmissive display region 111, such that lengths of the connection lines 13 electrically connected to the third pixel drive circuit 1121c and the fourth pixel drive circuit 1121d are different.

As shown in Table 1 below, Table 1 is a corresponding table of a row of light-emitting elements 1111 in the light-transmissive display region 111 electrically connected to pixel drive circuit 1121 in the conventional display region 112 shown in FIG. 6. Exemplarily, a row of light-emitting elements 1111 disposed in the light-transmissive display region 111 includes 20 pixels, and each of the pixels includes four light-emitting elements. The four light-emitting elements in each of the pixels include two first light-emitting elements 1111x and two second light-emitting elements 1111y. The first light-emitting element 1111x includes a green light-emitting elements G, and the second light-emitting element 1111y includes a blue light-emitting element B and a red light-emitting element R. Then it is considered that 40 light-emitting elements in one row of light-emitting elements are electrically connected to the pixel drive circuit 1121 in the conventional display region 112 disposed on the left side of the light-transmissive display region 111, and another 40 light-emitting elements in the one row of light-emitting elements are electrically connected to the pixel drive circuit 1121 in the conventional display region 112 disposed on the right side of the light-transmissive display region 111. $1^{th}$ to $20^{th}$ columns of the pixel drive circuits 1211 in the conventional display region 112 closer to the light-transmissive display region 111 are electrically connected to the first light-emitting elements 1111x, and $21^{th}$ to $40^{th}$ columns of the pixel drive circuits 1211 are electrically connected to the second light-emitting elements 1111y.

TABLE 1

| The light-emitting element is connected to the pixel drive circuit in the conventional display region disposed on the left side of the light-transmissive display region. | | | | The light-emitting element is connected to the pixel drive circuit in the conventional display region disposed on the right side of the light-transmissive display region. | | | |
|---|---|---|---|---|---|---|---|
| the columns of the pixel drive circuits | the columns of the light-emitting elements | the colors of the light-emitting elements | the length of the connection line (μm) | the columns of the pixel drive circuits | the columns of the light-emitting elements | the colors of the light-emitting elements | the length of the connection line (μm) |
| 1 | 2 | G | 95 | 1 | 1 | G | 104 |
| 2 | 4 | G | 295 | 2 | 3 | G | 283 |
| 3 | 6 | G | 487 | 3 | 5 | G | 477 |
| 4 | 8 | G | 680 | 4 | 7 | G | 670 |
| ... | ... | ... | ... | ... | ... | ... | ... |
| 20 | 40 | G | 3774 | 20 | 39 | G | 3763 |
| 21 | 1 | R | 2644 | 21 | 2 | B | 2700 |
| 22 | 3 | B | 2837 | 22 | 4 | R | 2893 |
| ... | ... | ... | ... | ... | ... | ... | ... |
| 39 | 37 | R | 6124 | 39 | 38 | B | 6177 |
| 40 | 39 | B | 6313 | 40 | 40 | R | 6374 |

Referring to Table 1, in the $1^{th}$ to $20^{th}$ columns of the pixel drive circuits connected to the first light-emitting elements 1111x, the length of the connection line electrically connected to the pixel drive circuit in the conventional display region disposed on the left side of the light-transmissive display region is a first length; and the length of the connection line electrically connected to the pixel drive circuit in the conventional display region disposed on the right side of the light-transmissive display region is a second length. The first length is greater than the second length, and a difference between the first length and the second length is about 10 μm. In the $21^{th}$ to $40^{th}$ columns of the pixel drive circuits connected to the second light-emitting elements 1111y, the length of the connection line electrically connected to the pixel drive circuit in the conventional display region disposed on the left side of the light-transmissive display region is a third length; and the length of the connection line electrically connected to the pixel drive circuit in the conventional display region disposed on the right side of the light-transmissive display region is a fourth length. The third length is greater than the fourth length, and the difference between the third length and the fourth length is about 50 μm.

Differences between the plurality of connection lines electrically connected to the first light-emitting elements 1111x are less than differences between the plurality of connection lines electrically connected to the second light-emitting elements 1111y. For example, in FIG. 6, the edge of the light-transmissive display region 111 is closer to the pixel drive circuit in the conventional display region 112 disposed on the left side of the light-transmissive display region 111, which is referred to as the light-transmissive display region 111 being offset to the left. The first length of the plurality of connection lines 13 electrically connected to the first light-emitting element 1111x described above is greater than the second length, and the third length of the plurality of connection lines 13 electrically connected to the second light-emitting element 1111y is less than the fourth length, and therefore, the light-transmissive display region 111 being offset to the left is capable of reducing the difference between the connection lines respectively disposed on the two sides of the light-transmissive display region 111 and electrically connected to the first light-emitting element 111x, and, at the same time, increasing the difference between the connection lines 13 respectively disposed on the two sides of the light-transmissive display region and electrically connected to the second light-emitting element 1111y.

It should be noted that, the number of columns of the pixel drive circuits in FIG. 5, FIG. 6 and Table 1 is the number of columns relative to the light-emitting elements electrically connected to a row of light-emitting elements shown in FIG. 5 and FIG. 6. For example, a first column of pixel drive circuits in FIG. 5 is not a first column of pixel drive circuits in the pixel drive circuits electrically connected to other rows of light-emitting elements disposed in the light-transmissive display region. In the case that a position where a row of light-emitting elements is disposed in the light-transmissive display region is different from a position where a row of light-emitting elements shown in FIG. 5 and FIG. 6 is disposed (that is, another row of light-emitting elements), the number of columns of the pixel drive circuits electrically connected to the another row of light-emitting elements changes, and a position of the first column of pixel drive circuits changes as well.

Due to the different lengths of the connection line 13, resistances and capacitances loading on the connection lines 13 are different. In the case that the drive current emitted from the pixel drive circuit 1121 intends to drive the light-emitting element 1111, the connection line 13 is charged first, and then the light-emitting element 1111 is started. Thus, the light-emitting elements 1111 of the same type electrically connected to the first pixel drive circuit 1121a and the second pixel drive circuit 1121b are charged and discharged at different rates. Exemplarily, the length of the connection line 13 electrically connected to the first pixel drive circuit 1121a is less than the length of the connection line 13 electrically connected to the second pixel drive circuit 1121b. Therefore, in the case that the display panel 10 provides a same signal to the connection line 13, the charging or discharging rate of the light-emitting element 1111 electrically connected to the first pixel drive circuit 1121a is slower than the charging or discharging rate of the light-emitting element 1111 electrically connected to the second pixel drive circuit 1121b, such that the light-up time of the light-emitting element 1111 electrically connected to the first pixel drive circuit 1121a and the light-emitting element 1111 electrically connected to the second pixel drive circuit 1121b differs significantly. In this way, the brightness of the light-emitting element 1111 electrically connected to the first pixel drive circuit 1121a is different from the brightness of the light-emitting element 1111 electrically connected to the second pixel drive circuit 1121b, and thus a display uniformity of the display of the light-transmissive display region 111 is poor.

Some embodiments of the present disclosure provide a display panel and a display device, which is capable of solving the above problem.

Figure 7:
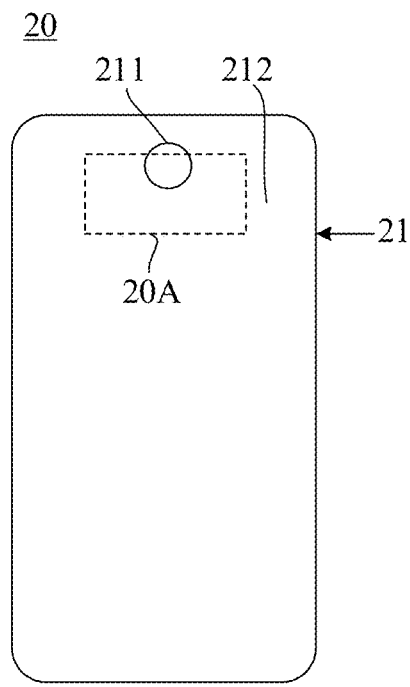
FIG. 7 is a top view of a display panel according to some embodiments of the present disclosure.
Figure 8:
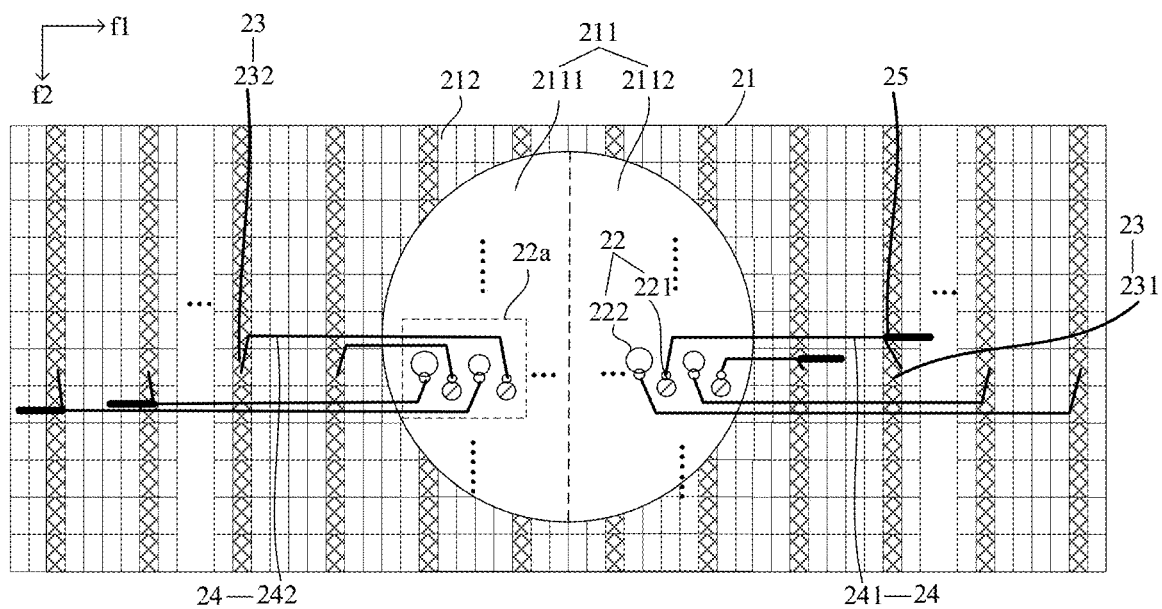
FIG. 8 is a schematic diagram of a connection wiring in a light-transmissive display region and a conventional display region of the display panel shown in FIG. 7.

FIG. 7 is a top view of a display panel according to some embodiments of the present disclosure. FIG. 8 is a schematic diagram of a connection wiring in a light-transmissive display region and a conventional display region of the display panel shown in FIG. 7. Referring to FIG. 7 and FIG. 8, the display panel 20 includes: a substrate 21, a plurality of light-emitting elements 22, a plurality of pixel drive circuits 23, a plurality of connection lines 24, and a plurality of compensation portions 25.

The substrate 21 includes a light-transmissive display region 211, and a conventional display region 212 disposed on the periphery of the light-transmissive display region 211. Exemplarily, the conventional display region 212 surrounds the light-transmissive display region 211. That is, the light-transmissive display region 211 is surrounded by the conventional display region 212. The position of the light-transmissive display region 211 is determined according to actual needs. For example, the light-transmissive display region 211 is disposed on the top center of the substrate 21. Hardware such as a photo-sensitive sensor (e.g., a camera) is arranged in the light-transmissive display region 211 of the display panel. The light-transmissive display region 211 is circular as shown in FIG. 4, or square, hexagonal, trapezoidal, or other shapes, which is not limited herein.

The plurality of light-emitting elements 22 are disposed in the light-transmissive display region 211, and the plurality of light-emitting elements 22 are arranged along a first direction.

The plurality of pixel drive circuits 23 are disposed in the conventional display region 212, and the plurality of connection lines 24 and the plurality of compensation portions 25 are disposed on the substrate 21.

The plurality of pixel drive circuits 23 disposed in the conventional display region 212 are electrically connected to the plurality of light-emitting elements 22 at least disposed in the light-transmissive display region 211. In this way, the light transmittance of the light-transmissive display region 211 is improved. That is, only the light-emitting elements 22 are arranged in the light-transmissive display region 211, and the pixel drive circuits 23 for driving the light-emitting elements 22 of the light-transmissive display region 211 are arranged in the conventional display region 212. The pixel drive circuits 23 are electrically connected to the light-emitting elements 22 in one-to-one correspondence by the connection lines 24. That is, the light transmittance of the light-transmissive display region 211 is improved by arranging the light-emitting element 22 and the pixel drive circuit 23 separately.

The plurality of pixel drive circuits 23 at least include a first pixel drive circuit 231 and a second pixel drive circuit 232. The first pixel drive circuit 231 and the second pixel drive circuit 232 are respectively disposed on two sides in the first direction f1 of the light-transmissive display region 211.

The first pixel drive circuit 231 and the second pixel drive circuit 232 are respectively electrically connected to the light-emitting elements 22 by the connection lines 24, which includes a first connection line 241 and a second connection line 242. A length of the first connection line 241 electrically connected to the first pixel drive circuit 231 is less than a length of the second connection line 242 electrically connected to the second pixel drive circuit 232.

Exemplarily, as shown in FIG. 8, the plurality of light-emitting elements 22 include a plurality of pixel drive circuit groups 22a, and a pixel drive circuit group 22a is a pixel. The first pixel drive circuit 231 is electrically connected to one light-emitting element 22 in one light-emitting element group 22a, and the second pixel drive circuit 232 is electrically connected to one light-emitting element 22 in another light-emitting element group 22a, such that a difference between the lengths of the connection lines 24 electrically connected to the two light-emitting elements 22 as described above is small. Distances between the two light-emitting elements 22 and an edge of the light-transmissive display region 211 are different, and therefore, the length of the connection line 24 electrically connected to the first pixel drive circuit 231 is less than the length of the connection line 24 electrically connected to the second pixel drive circuit 232.

It should be noted that, the first pixel drive circuit 231 and the second pixel drive circuit 232 according to some embodiments of the present disclosure do not specifically refer to the pixel drive circuits 23 disposed on a fixed side of the light-transmissive display region 211. The plurality of pixel drive circuits 23 disposed on the same side are connected to different types of light-emitting elements, and thus in the plurality of pixel drive circuits 23 disposed on a side, the length of the electrically connected connection line 24 is less than the length of the connection line 24 electrically connected to the pixel drive circuit 23 disposed on a symmetrical position.

The compensation portion 25 is connected to the first connection line 241, and the compensation portion 25 is electrically connected to the first connection line 241. That is, the compensation portion 25 is electrically connected to the first connection line 241 of which the length is short, the first connection line 241 is electrically connected to the first pixel drive circuit 231, and the compensation portion 25 is configured to compensate a capacitance of the first connection line 241, such that a difference between the capacitance of the first connection line 241 electrically connected to the first pixel drive circuit 231 and a capacitance of the second connection line 242 electrically connected to the second pixel drive circuit 232 is small. In this way, the start time of the light-emitting element 22 electrically connected to the first pixel drive circuit 231 and the start time of the light-emitting element 22 electrically connected to the second pixel drive circuit 232 are the same, such that the brightness of the light-emitting element 22 electrically connected to the first pixel drive circuit 231 and a brightness of the light-emitting element 22 electrically connected to the second pixel drive circuit 232 are the same, and thus a display uniformity of the light-transmissive display region 111 is improved. The first connection line 241 and the second connection line 242 therein are two connection lines in the plurality of connection lines 24.

It should be noted that, in order to facilitate the distinction between the light-transmissive display region 211 and the conventional display region 212 in FIG. 8, the light-emitting elements at a junction of the light-transmissive display region 211 and the conventional display region 212 are not completely shown. In an actual display panel, the junction of the light-transmissive display region 211 and the conventional display region 212 is provided with a plurality of light-emitting elements, and the plurality of light-emitting elements belongs to the light-transmissive display region 211 or the conventional display region 212.

Only a connection mode in which a portion of the plurality of light-emitting elements 22 is electrically connected to the pixel drive circuit 23 is shown in FIG. 8. Connection modes in which other light-emitting elements 22 are connected to other pixel drive circuits 23 are identical to the connection mode.

In some embodiments of the present disclosure, the first light-emitting element 221 and the second light-emitting element 222 are organic light-emitting diode (OLED) light-emitting elements, which at least include: an anode, a light-emitting layer, and a cathode that are stacked along a direction perpendicular to and away from the substrate 21.

The anode in the light-emitting element 22 is electrically connected to the pixel drive circuit 23 by the connection line 24. To further improve the light transmittance of the light-transmissive display region 211, a connection line 24 made of a light-transmissive conductive material is used to connect the light-emitting element 22 in the light-transmissive display region 211 to the pixel drive circuit 23 in the conventional display region 212. The light-transmissive conductive material is indium tin oxide (ITO).

In summary, some embodiments of the present disclosure provide a display panel, including the plurality of pixel drive circuits, the plurality of connection lines, and the plurality of compensation portions. The length of the first connection line electrically connected to the first pixel drive circuit is less than the length of the second connection line electrically connected to the second pixel drive circuit. The capacitance of the first connection line is compensated by electrically connecting the compensation portion to the first connection line, thereby reducing the difference between the capacitance of the first connection line and the capacitance of the second connection line. In this way, a difference between the start time of the light-emitting element electrically connected to the first pixel drive circuit and the start time of the light-emitting element electrically connected to the second pixel drive circuit is small, such that the display uniformity of the light-transmissive display region is improved.

Optionally, in some embodiments of the present disclosure, one pixel circuit is configured to drive a plurality of light-emitting elements, which have the same color. Alternatively, a plurality of pixel drive circuits drive one light-emitting element. Alternatively, a plurality of pixel drive circuits drive a plurality of light-emitting elements in one-to-one correspondence.

Optionally, an absolute value of a difference between a sum of the capacitance of the compensation portion 25 and the capacitance of the first connection line 241 and the capacitance of the second connection line 242 is less than a preset value, which is 2.8 μF. In this range, the difference between the start time of the light-emitting element 22 electrically connected to the first connection line 241 and the start time of the light-emitting element 22 electrically connected to the second connection line 242 is small, and thus an effect on the display effect of the light-transmissive display region 211 is small. It should be noted that, the preset value is adjusted according to design requirements of the display panel, which is not limited herein.

That is, in the case that the difference between the capacitance of the first connection line 241 and the capacitance of the second connection line 242 is within the preset value, the first connection line 241 is not electrically connected to the compensation portion 25 so as to simplify the manufacturing process of the display panel 20.

Optionally, as shown in FIG. 8, the plurality of light-emitting elements 22 include at least one row of light-emitting elements 22, and a row of light-emitting elements 22 in the at least one row of light-emitting elements 22 includes a plurality of light-emitting element groups 22a. Each of the light-emitting element groups 22a includes a plurality of light-emitting elements 22, and the first direction f1 is parallel to a row direction of a row of light-emitting elements 22.

Optionally, as shown in FIG. 8, the plurality of pixel drive circuits 23 include a plurality of columns of pixel drive circuits 23 arranged on the substrate, and the plurality of columns of pixel drive circuits 23 are arranged along the first direction f1. A column of pixel drive circuits 23 includes a plurality of pixel drive circuits 23 arranged along a second direction f2. An included angle between the second direction f2 and the first direction f1 is greater than 0 degree and less than or equal to 90 degrees. Exemplarily, the included angle between the second direction f2 and the first direction f1 is 90 degrees.

The first pixel drive circuit 231 is disposed in an $n^{th}$ column of pixel drive circuits 23 disposed on the first side of the light-transmissive display region 211, and the second pixel drive circuit 232 is disposed in an $n^{th}$ column of pixel drive circuits 23 disposed on a second side of the light-transmissive display region 211. The first side and the second side are the two sides of the light-transmissive display region 211 in the first direction f1, and n is an integer greater than or equal to 1.

Exemplarily, the first pixel drive circuit 231 is disposed in the first column of pixel drive circuits 23 disposed on the first side of the light-transmissive display region 211, and the second pixel drive circuit 232 is disposed in the first column of pixel drive circuits 23 disposed on the second side of the light-transmissive display region 211. The light-emitting elements 22 electrically connected to the first pixel drive circuit 231 and the second pixel drive circuit 232 respectively belong to two light-emitting element groups 22a. The distance between the first pixel drive circuit 231 and the edge of the light-transmissive display region 211 and the distance of the second pixel drive circuit 232 and the edge of the light-transmissive display region 211 are the same or not, which is not limited herein.

Figure 9:
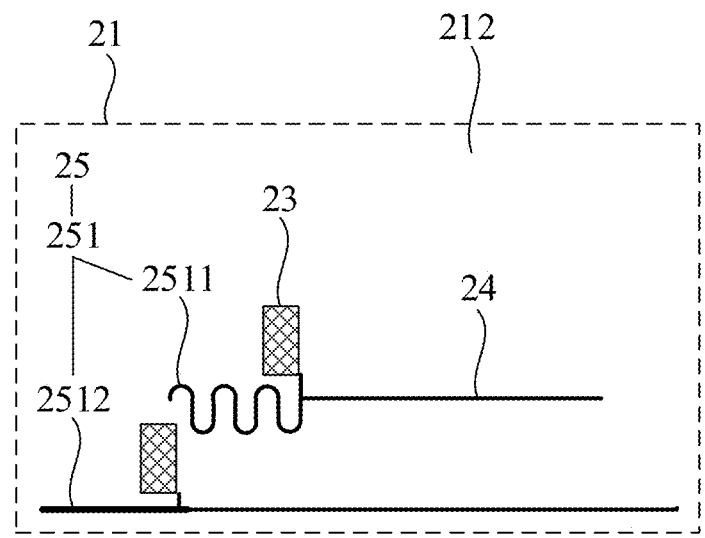
FIG. 9 is a structural schematic diagram of a compensation portion according to some embodiments of the present disclosure.

Optionally, as shown in FIG. 9, FIG. 9 is a structural schematic diagram of a compensation portion according to some embodiments of the present disclosure. The compensation portion 25 includes a linear compensation portion 251, which is disposed in the conventional display region 212. The linear compensation portion 251 includes a straight-line compensation portion 2512 or a curved-line compensation portion 2511. The straight-line compensation portion 2512 or the curved-line compensation portion 2511 is electrically connected to the connection line 24 electrically connected to the first pixel drive circuit 231. The straight-line compensation portion 2512 or the curved-line compensation portion 2511 is disposed in a blank region without devices such as wirings in the conventional display region 212. The area of the curved-line compensation portion 2511 is larger than the area of the straight-line compensation portion, thereby further increasing the capacitance of the connection line 24 electrically connected to the first pixel drive circuit 231. In this way, the difference between the capacitance of the connection line 24 electrically connected to the first pixel drive circuit 231 and the capacitance of the connection line 24 electrically connected to the second pixel drive circuit 232 is smaller, thereby improving the display uniformity of the light-transmissive display region 111.

Figure 10:
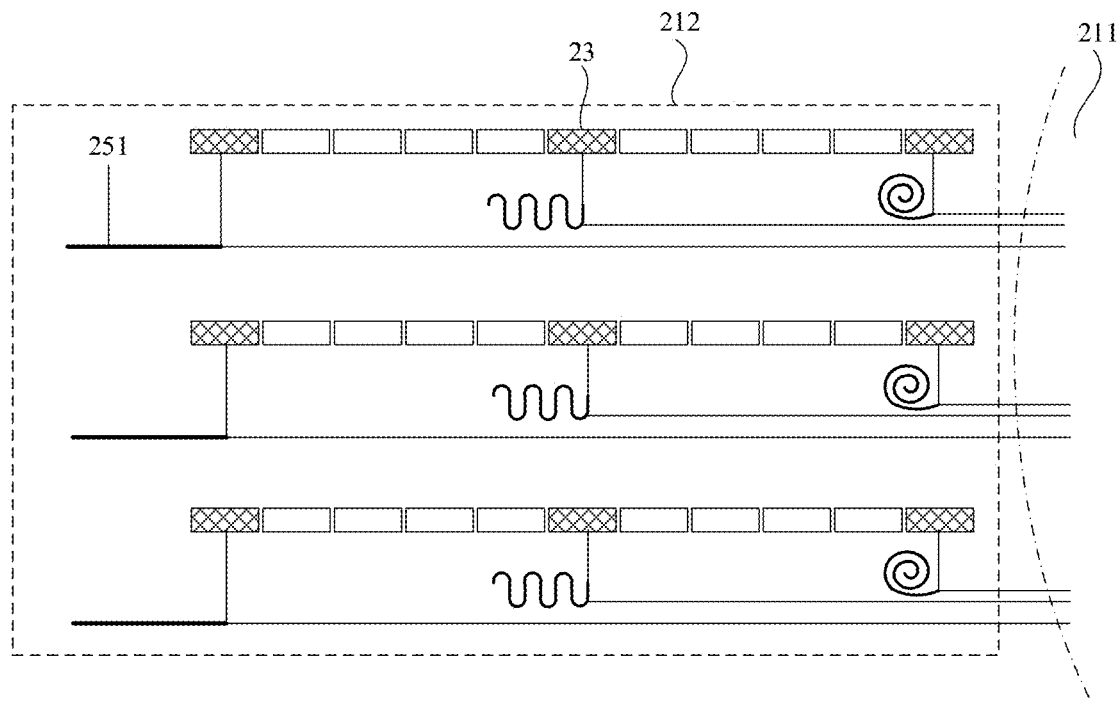
FIG. 10 is a structural schematic diagram of a compensation portion according to some embodiments of the present disclosure.

Optionally, FIG. 10 is a structural schematic diagram of another compensation portion according to some embodiments of the present disclosure. The shape of the linear compensation portion 251 includes at least one of a straight line, an S-shaped winding line, a spiral winding line, and a broken line, and the shape of the linear compensation portion 251 further includes other shapes such as a Z-shaped winding line. The linear compensation portion 251 is disposed on an end, distal from the light-transmissive display region 111, of the first connection line 241. The end, distal from the light-transmissive display region 111, of the first connection line 241 is electrically connected to the first pixel drive circuit 231 in the conventional display region 211. An end, proximal to the light-transmissive display region 111, of the linear compensation portion 251 is electrically connected to the first connection line 241. That is, it is considered that the first connection line 241 extends a certain distance along a direction away from the light-transmissive display region 111 at a connection with the first pixel drive circuit 231, and the extension portion is the linear compensation portion 251.

Figure 11:
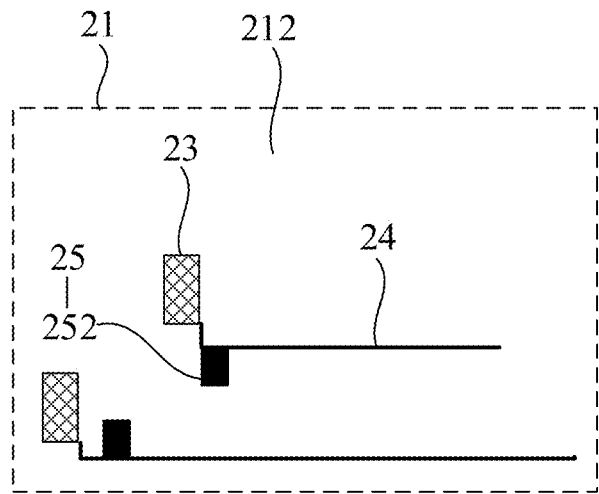
FIG. 11 is a structural schematic diagram of a compensation portion according to some embodiments of the present disclosure.

Optionally, as shown in FIG. 11, FIG. 11 is a structural schematic diagram of still another compensation portion according to some embodiments of the present disclosure. The compensation portion 25 includes a block compensation portion 252, which is disposed in the conventional display region 212. The block compensation portion 252 is electrically connected to the connection line 24 electrically connected to the first pixel drive circuit 231 and is disposed in the blank region without devices such as wirings in the conventional display region 212. Compared with the linear compensation portion 251, the area of the block compensation portion 252 is larger. In this way, the capacitance of the connection line 24 electrically connected to the first pixel drive circuit 231 is further increased, such that the difference between the capacitance of the connection line 24 electrically connected to the first pixel drive circuit 231 and the capacitance of the connection line 24 electrically connected to the second pixel drive circuit 232 is smaller, and thus the display uniformity of the light-transmissive display region 111 is improved.

Optionally, the shape of the block compensation portion 252 includes at least one of a rectangle, a triangle, a diamond, a circle, and a hexagon, and the shape of the block compensation portion 252 further includes other shapes such as a trapezoid.

Figure 12:
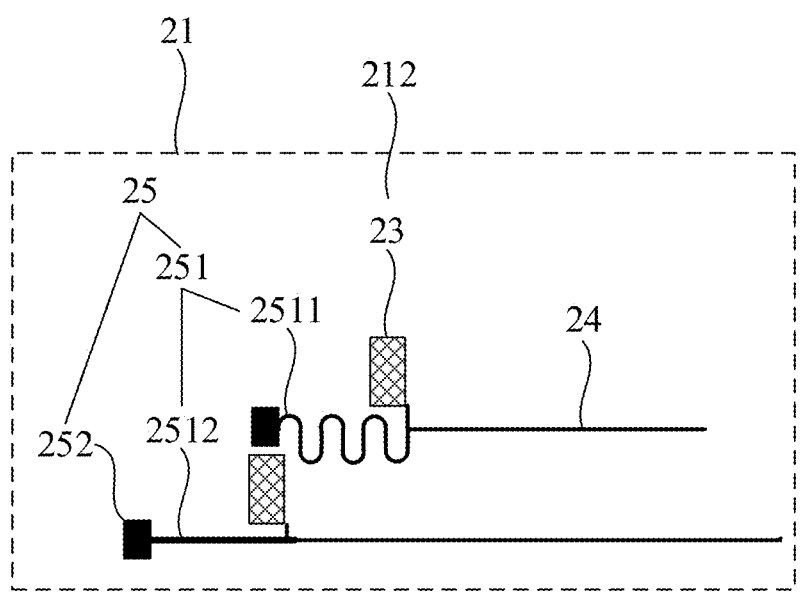
FIG. 12 is a structural schematic diagram of a compensation portion according to some embodiments of the present disclosure.

Optionally, as shown in FIG. 12, FIG. 12 is a structural schematic diagram of still another compensation portion according to some embodiments of the present disclosure. The compensation portion 25 includes the linear compensation portion 251 and the block compensation portion 252 that are disposed in the conventional display region 212. In this way, the flexibility of arranging the compensation portion 25 is improved, such that the blank region in the conventional display region 212 is reasonably utilized.

Optionally, as shown in FIG. 12, one end of the linear compensation portion 251 is electrically connected to the first connection line 231, and the other end of the linear compensation portion 251 is electrically connected to the block compensation portion 252. The linear compensation portion 251 flexibly extends on the substrate to a region far from an end of the first connection line 231, and the area of the block compensation portion 252 is large. In this way, the area of the compensation portion 25 is caused to be large while increasing the flexibility of the position of the compensation portion 25.

Optionally, the connection line 24 and the compensation portion 25 are disposed in the same layer structure and are made of the same material. The compensation portion 25 and the connection line 24 are prepared by a one-time patterning process to simplify the preparation steps of the display panel 20. The compensation portion 25 is disposed on an end, distal from the light-transmissive display region 111, of the first connection line 231. In this way, the capacitance of the first connection line 231 is compensated without affecting the wiring space of the plurality of connection lines 231.

Optionally, as shown in FIG. 8, each of the light-emitting element groups 22a includes at least two first light-emitting elements 221 and at least two second light-emitting elements 222.

The first light-emitting element 221 and the second light-emitting element 222 are two different types of light-emitting elements, and difficulties in starting the two different types of light-emitting elements are different. The difficulty in starting the first light-emitting element 221 is greater than the difficulty in starting the second light-emitting element 222. In the case that the length of the connection line 24 electrically connected to the first light-emitting element 221 and the length of the connection line 24 electrically connected to the second light-emitting element 222 are the same, the start time of the first light-emitting element 221 is greater than the start time of the second light-emitting element 222.

As shown in FIG. 8, the first light-emitting element 221 and the second light-emitting element 222 are arranged alternately in the first direction f1. It should be noted that, the plurality of light-emitting element groups 22a in some embodiments of the present disclosure are disposed in a row, and a plurality of light-emitting elements 22 in each of the light-emitting element groups 22a are arranged staggered, and further, connection positions between the plurality of light-emitting elements 22 in each of the light-emitting element groups 22a and the connection line 24 are disposed in a row. The first light-emitting element 221 and the second light-emitting element 222 include at least two colors of light-emitting elements 22 which are alternately arranged, such that a color of a display screen of the light-transmissive display region 211 is uniform.

Optionally, the plurality of light-emitting element groups 22a include a first light-emitting element group and a second light-emitting element group. The plurality of first connection lines 241 are electrically connected to a plurality of light-emitting elements 22 in the first light-emitting element group and the plurality of first pixel drive circuits 231, and the plurality of second connection lines 242 are electrically connected to a plurality of light-emitting elements 22 in the second light-emitting element group and the plurality of second pixel drive circuits 232. The length of the first connection line 241 is less than the length of the second connection line 242. That is, the lengths of the plurality of first connection lines 241 electrically connected to the plurality of light-emitting elements 22 in the first light-emitting element group are less than the lengths of the second connection lines 242 electrically connected to the plurality of light-emitting elements 22 in the second light-emitting element group. The compensation portion 25 is electrically connected to at least a portion of the first connection lines 241 to compensate the capacitance of the portion of the first connection lines 241 electrically connected to the first light-emitting element group.

The first light-emitting element group includes a first-color light-emitting element, a second-color light-emitting element, and a third-color light-emitting element. At least a portion of the connection lines electrically connected to the first-color light-emitting element and the second-color light-emitting element are electrically connected to the compensation portion, and the connection line electrically connected to the third-color light-emitting element is not electrically connected to the compensation portion.

Figure 13:
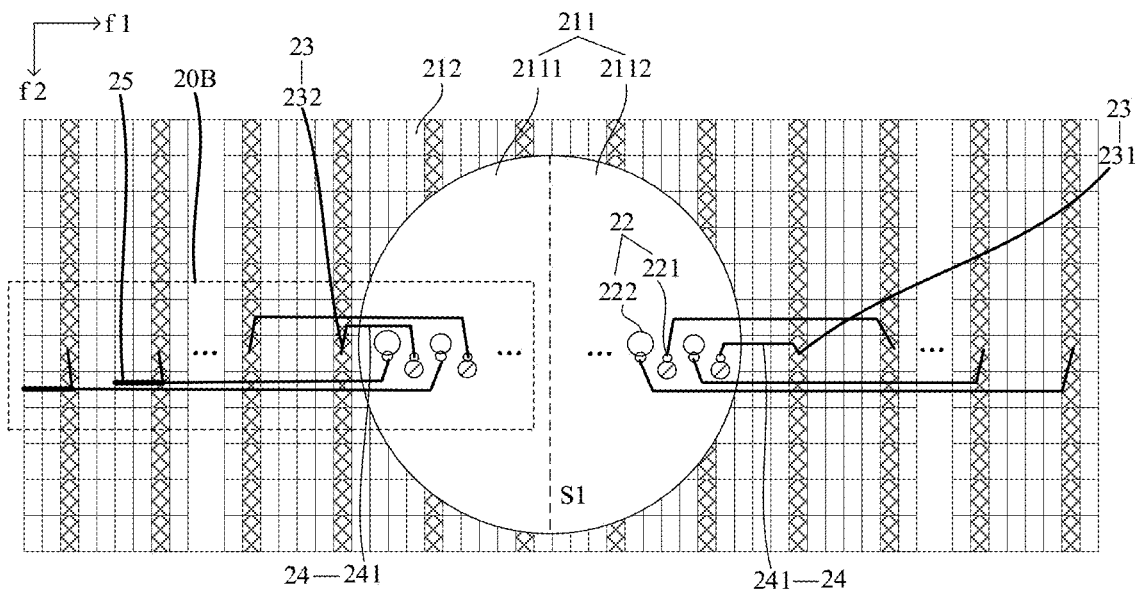
FIG. 13 is a schematic diagram of a connection wiring in a light-transmissive display region and a conventional display region of a display panel according to some embodiments of the present disclosure.

As shown in FIG. 13, FIG. 13 is a schematic diagram of another connection wiring of a light-transmissive display region and a conventional display region in a display panel according to some embodiments of the present disclosure. The light-transmissive display region 211 is closer to the pixel drive circuit 23 in the conventional display region 212 disposed on the left side of the light-transmissive display region 211. The distance between the first light-emitting element 221 and the edge of the left side of the light-transmissive display region 211 is less than the distance between the first light-emitting element 221 and the edge of the right side of the light-transmissive display region 211, and the distance between the second light-emitting element 222 and the edge of the left side of the light-emitting display region 211 is greater than a distance between the second light-emitting element 222 and the edge of the right side of the light-transmissive display region 211. Therefore, a difference between the connection lines 24 respectively disposed on the two sides of the light-transmissive display region 211 and electrically connected to the first light-emitting element 221 is less than a difference between the connection lines 24 respectively disposed on the twos sides of the light-transmissive display region 211 and electrically connected to the second light-emitting element 222.

Figure 14:
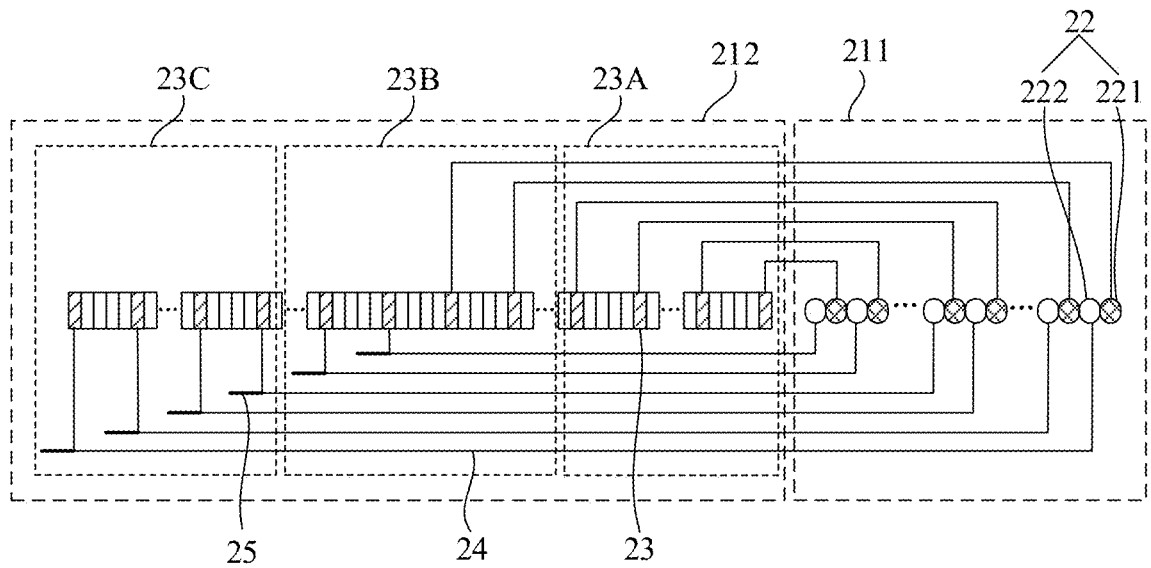
FIG. 14 is a structural schematic diagram of a portion 20B in the connection wiring schematic diagram shown in FIG. 13.

Optionally, as shown in FIG. 14, FIG. 14 is a structural schematic diagram of a portion 20B in the connection wiring schematic diagram shown in FIG. 13. The pixel drive circuit 23 electrically connected to the first light-emitting element 221 is disposed on a side, proximal to the light-transmissive display region 211, of the pixel drive circuit 23 electrically connected to the second light-emitting element 222. As described above, the first light-emitting element 221 and the second light-emitting element 222 are two different types of light-emitting elements, and the difficulties in starting the two different types of light-emitting elements are different. The difficulty in starting the first light-emitting element 221 is greater than the difficulty in starting the second light-emitting element 222. In the case that the length of the connection line 24 electrically connected to the first light-emitting element 221 and the length of the connection line 24 electrically connected to the second light-emitting element 222 are the same, the start time of the first light-emitting element 221 is greater than the start time of the second light-emitting element 222. In this way, the pixel drive circuit 23, which is closer to the light-transmissive display region 211, is electrically connected to the first light-emitting element 221, such that the length of the connection line 24 electrically connected to the first light-emitting element 221 is short, and thus the efficiency in driving the first light-emitting element 221 is improved and the start time of the first light-emitting element 221 is avoided being long or difficult to drive.

Exemplarily, as shown in FIG. 14, the pixel drive circuits 23 disposed in the conventional display region 212 are divided into three groups of pixel drive circuits along a direction away from the light-transmissive display region 212: a first pixel drive circuit group 23A, a second pixel drive circuit group 23B, and a third pixel drive circuit group 23C. The connection line 24 electrically connected to the first pixel drive circuit group 23A is disposed in a first structural layer, the connection line 24 electrically connected to the second pixel drive circuit group 23B is disposed in a second structural layer, and the connection line 24 electrically connected to the third pixel drive circuit group 23C is disposed in a third structural layer. The first structural layer, the second structural layer, and the third structural layer are different film layers in the display panel 20.

In this way, the wiring space of the connection lines 24 is increased, such that the connection lines 24 disposed in different layers have their own wiring space. A larger number of connection lines 24 are arranged in limited space compared with a wiring method of single-layer wiring.

Differences between the plurality of connection lines 24 electrically connected to the first light-emitting element 221 in the display panel shown in FIG. 13 are small, and thus the length differences of the plurality of connection lines 24 electrically connected to the first light-emitting element 221 have less effect on the display effect of the light-transmissive display region 211. Therefore, the plurality of connection lines 24 electrically connected to the first light-emitting element 221 are provided without the compensation portions 25, and only a short portion of the plurality of connection lines 24 electrically connected the second light-emitting element 222 is compensated.

Figure 15:
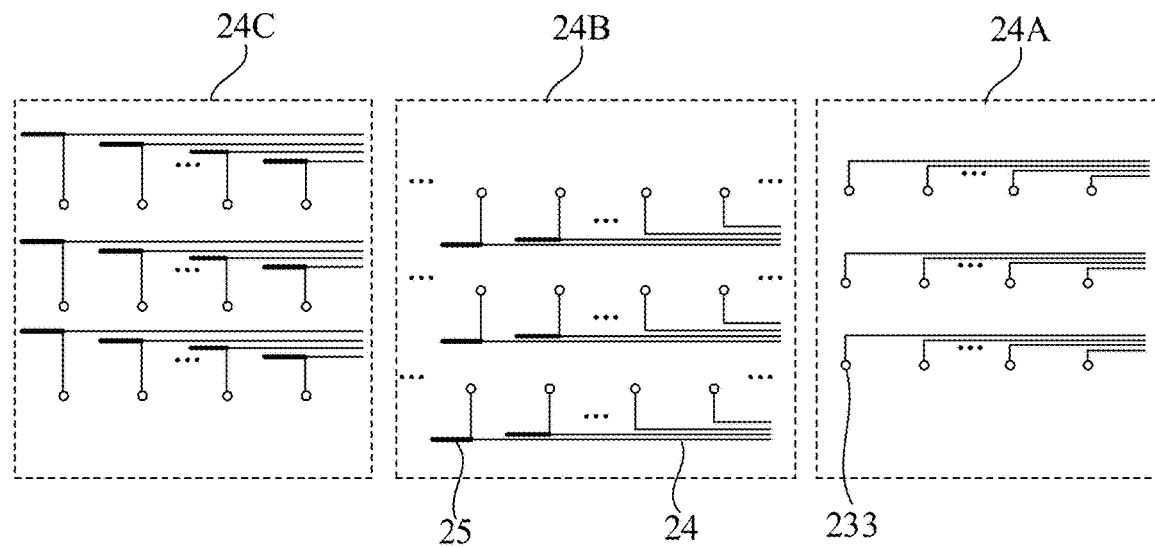
FIG. 15 is a structural schematic diagram of a three-layers wiring shown in FIG. 14.

As shown in FIG. 15, FIG. 15 is a structural schematic diagram of a three-layers wiring shown in FIG. 14. The pixel drive circuit 23 includes an adapter hole 233, and the pixel drive circuit 23 is electrically connected to the connection line 24 via the adapter hole 233. Because the pixel drive circuits 23 in the first pixel drive circuit group 23A disposed in the first structural layer 24A and electrically connected to the connection lines 24 are electrically connected to the first light-emitting elements 221, the connection lines 24 in the first structural layer 24A are not connected to the compensation portion 25.

A portion of the pixel drive circuits 23 in the second pixel drive circuit group 23B disposed in the second structural layer 24B and electrically connected to the connection lines 24 are electrically connected to the first light-emitting element 221, and another portion of the pixel drive circuits 23 are electrically connected to the second light-emitting element 222, such that a portion of the connection lines 24 in the second structural layer 24B is connected to the compensation portion 25.

The pixel drive circuits 23 in the third pixel drive circuit group 23C electrically connected to the connection lines 24 in the third structural layer 24C are electrically connected to the second light-emitting element 222, such that the connection lines 24 in the third structural layer 24C are connected to the compensation portion 25.

Figure 16:
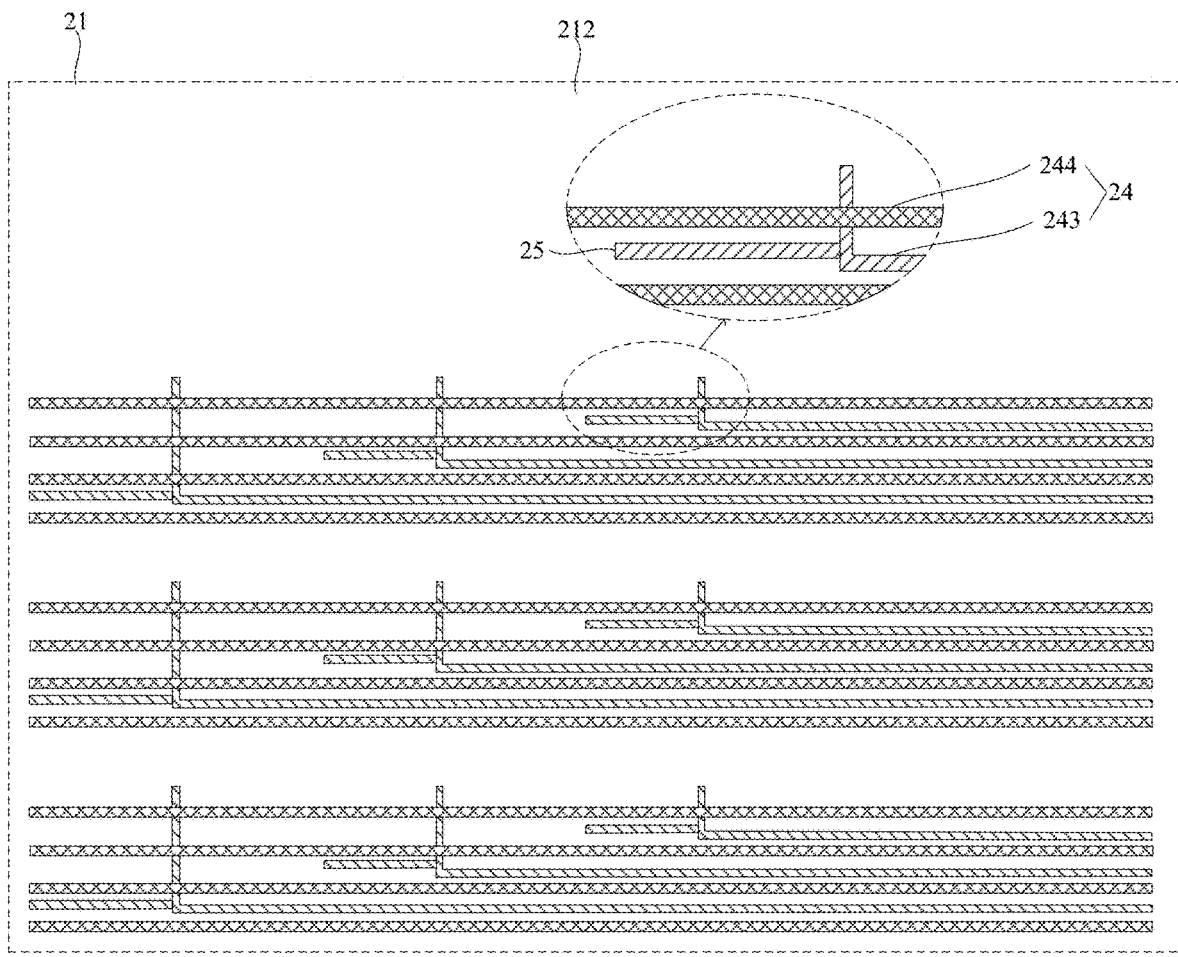
FIG. 16 is a structural schematic diagram of a compensation portion according to some embodiments of the present disclosure.

As shown in FIG. 16, FIG. 16 is a structural schematic diagram of still another compensation portion according to some embodiments of the present disclosure. FIG. 16 illustrates a schematic diagram of a wiring structure of the plurality of connection lines 24 in two structural layers. The plurality of connection lines 24 include a third connection line 243 and a fourth connection line 244 that are disposed in different layers. The third connection line 243 is electrically connected to the compensation portion 25, and an orthographic projection of the fourth connection line 244 onto the substrate 21 is staggered from an orthographic projection of the compensation portion 25 connected to the third connection line 243 onto the substrate 21. That is, the orthographic projection of the fourth connection line 244 onto the substrate 21 is not overlapped with the orthographic projection of the compensation portion 25 connected to the third connection line 243 onto the substrate 21.

Figure 17:
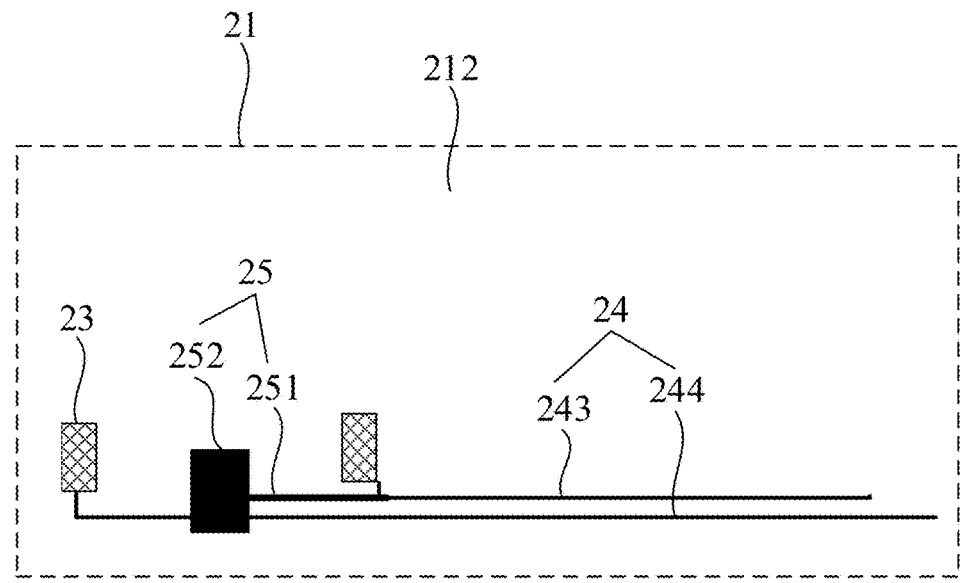
FIG. 17 is a structural schematic diagram of a compensation portion according to some embodiments of the present disclosure.
Figure 18:
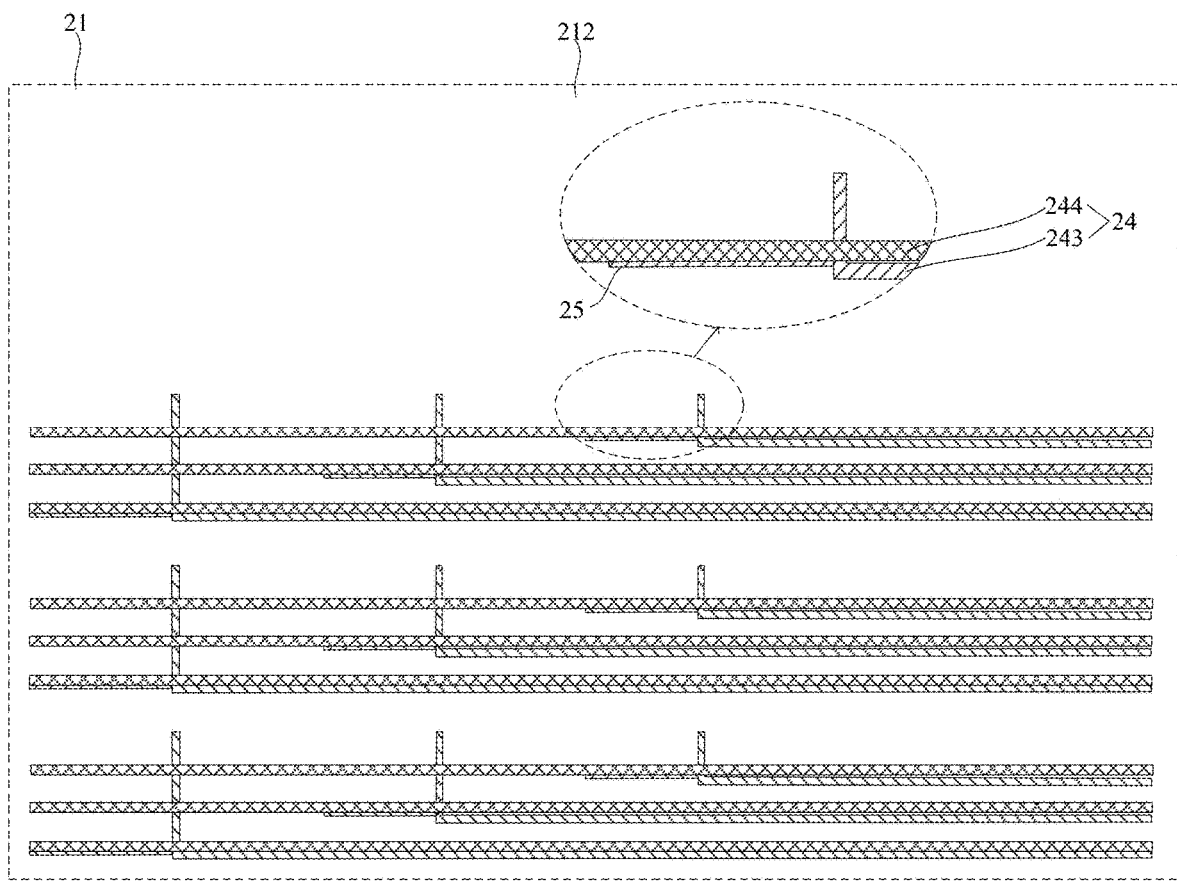
FIG. 18 is a structural schematic diagram of a compensation portion according to some embodiments of the present disclosure.

Optionally, as shown in FIG. 17 and FIG. 18, FIG. 17 is a structural schematic diagram of still another compensation portion according to some embodiments of the present disclosure, and FIG. 18 is a structural schematic diagram of still another compensation portion according to some embodiments of the present disclosure. The plurality of connection lines 24 include the third connection line 243 and the fourth connection line 244 that are disposed in different layers.

The third connection line 243 is electrically connected to the compensation portion 25, and the orthographic projection of the fourth connection line 244 onto the substrate 21 is at least partially overlapped with an orthographic projection of the compensation portion 25 onto the substrate 21. In this way, a parasitic capacitance is formed between the compensation portion 25 and the fourth connection line 244 to compensate the capacitance of the fourth connection line 244.

Optionally, as shown in FIG. 8, the light-transmissive display region 211 includes two light-transmissive sub-regions (a first light-transmissive sub-region 2111 and a second light-transmissive sub-region 2112) arranged along the first direction f1. The light-emitting element 22 within either of the two light-transmissive sub-regions is electrically connected to the pixel drive circuit 23 in the conventional display region 212 adjacent to either of the two light-transmissive sub-regions (the first light-transmissive sub-region 2111 or the second light-transmissive sub-region 2112).

Exemplarily, the second light-transmissive sub-region 2112 is disposed on the right side of the first light-transmissive sub-region 2111, and the light-emitting element 22 in the first light-transmissive sub-region 2111 is electrically connected to the pixel drive circuit 23 disposed on a left side of the first light-transmissive sub-region 2111.

Optionally, areas of the two light-transmissive sub-regions (the first light-transmissive sub-region 2111 and the second light-transmissive sub-region 2112) are the same. In this way, the number of light-emitting elements 22 in the two light-transmissive sub-regions (the first light-transmissive sub-region 2111 and the second light-transmissive sub-region 2112) are substantially the same, such that differences in overall lengths of the connection lines corresponding to the light-emitting elements 22 in the two light-transmissive sub-regions (the first light-transmissive sub-region 2111 and the second light-transmissive sub-region 2112) are small, and thus the brightness of the light-emitting elements in the light-transmissive display region 211 is uniform, and the display effect of the light-transmissive display region 211 is improved.

It should be noted that, a boundary between the two light-transmissive sub-regions in some embodiments of the present disclosure is a symmetry axis of the light-transmissive display region 211, and a plurality of connection lines disposed on a left side of the symmetry axis of the light-transmissive display region 211 and a plurality of connection lines disposed on a right side of the symmetry axis of the light-transmissive display region 211 are arranged in a mirror image.

Optionally, an area of the compensation portion 25 electrically connected to the first connection line 241 is positively correlated with a first difference, which is a difference between the length of the first connection line 241 and the length of the second connection line 242. That is, the greater the difference between the length of the first connection line 241 and the length of the second connection line 242, the greater the area of the compensation portion 25 electrically connected to the first connection line 241.

Figure 19:
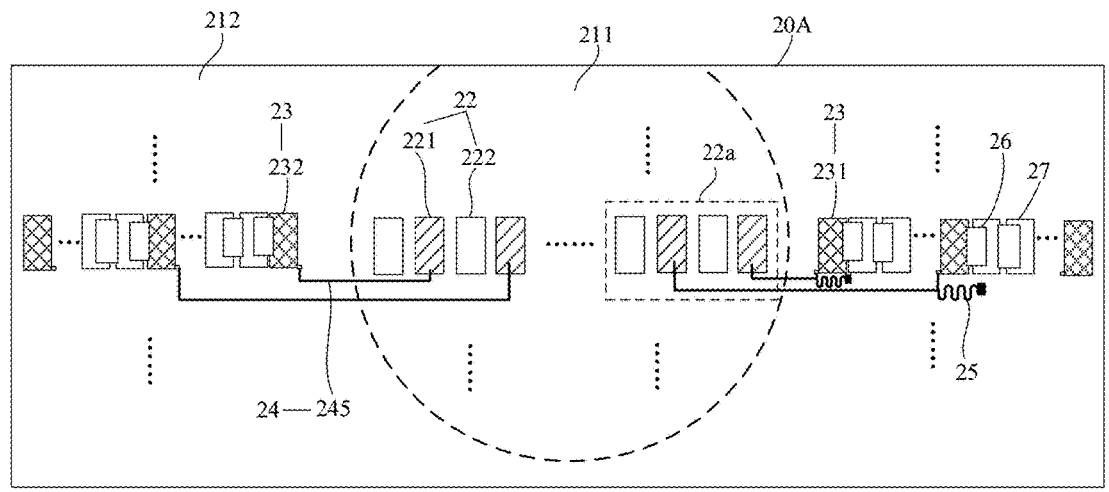
FIG. 19 is a partial structural schematic diagram of the display panel shown in FIG. 8.

Optionally, as shown in FIG. 19, FIG. 19 is a partial structural schematic diagram of the display panel as shown in FIG. 8. A shape of the light-emitting element 22 is a circle shown in FIG. 5, or a rectangle as shown in FIG. 10, or other shapes such as a diamond and a hexagon, which is not limited herein. The connection line 24 includes a metal connection line 245, and the metal connection line 245 is electrically connected to a first light-emitting element 221 nearest the edge of the light-transmissive display region 211 in a row of light-emitting elements 22. Because the wiring space of display panel 20 is limited, in the case that the wiring space of the above-mentioned three-layers connection lines 24 disposed in the first structural layer, the second structural layer, and the third structural layer is crowded, the light-emitting element 22 nearest the edge of the light-transmissive display region 211 is electrically connected to the pixel drive circuit 23 disposed in the conventional display region 212 by the metal connection line 245, and the metal connection line 245 is a fourth layer wiring. The first light-emitting element 221 closer to the edge of the light-transmissive display region 211 is electrically connected to the pixel drive circuit 23 closer to the edge of the light-transmissive display region 211 when connecting the light-emitting element 22 disposed in the light-transmissive display region 211, and therefore, one end of the metal connection line 245 is electrically connected to the first light-emitting element 221 nearest the edge of the light-transmissive display region 211 in a row of light-emitting elements 22, and the other end is electrically connected to the pixel drive circuit 23 nearest the edge of the light-transmissive display region 211 in the conventional display region, such that a portion of the metal connection line 245 disposed in the conventional display region 212 is prevented from affecting other structures on the display panel 20.

Moreover, because the first light-emitting element 221 electrically connected to the metal connection line 245 is closer to the edge of the light-transmissive display region 211, the effect of the metal connection line 245 on the light transmittance of the light-transmissive display region 211 is neglected. In this way, more light-emitting elements 22 are arranged in the light-transmissive display region 211, such that an area of the light-transmissive display region 211 is large.

Figure 20:
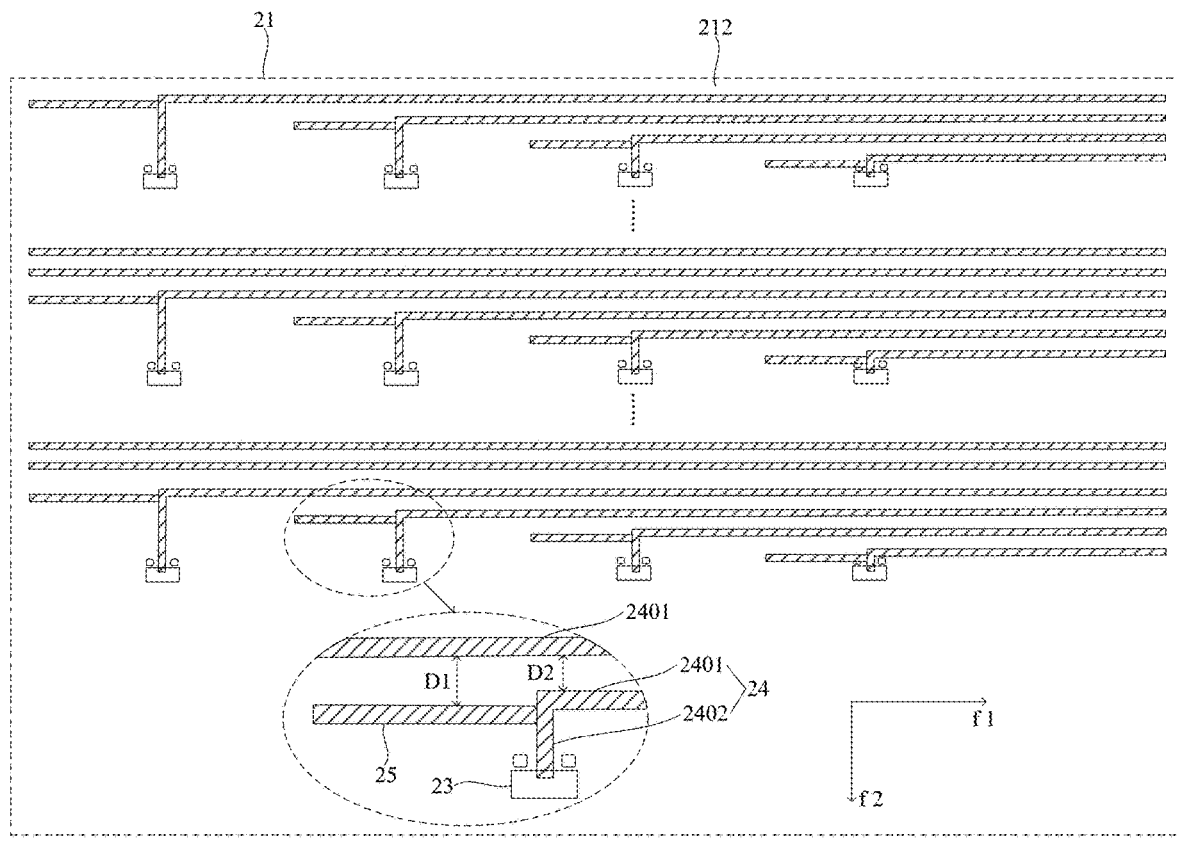
FIG. 20 is a structural schematic diagram of a compensation portion according to some embodiments of the present disclosure.

Optionally, as shown in FIG. 20, FIG. 20 is a structural schematic diagram of still another compensation portion according to some embodiments of the present disclosure. The connection line 24 includes a first sub-connection line 2401 and a second sub-connection line 2402 that are electrically connected. One end of the first sub-connection line 2401 is electrically connected to the light-emitting element and the other end is electrically connected to one end of the second sub-connection line 2402, and the other end of the second sub-connection line 2402 is electrically connected to the pixel drive circuit 23.

The first sub-connection line 2401 extends along the first direction f1, and a plurality of first sub-connection lines 2401 are arranged along the second direction f2. The compensation portion 25 is electrically connected to the second sub-connection line 2402, and the compensation portion 25 and the first sub-connection line 2401 are successively arranged in the second direction f2.

That is, the compensation portion 25 and the first sub-connection line 2401 are staggered in the second direction f2. Exemplarily, as shown in FIG. 20, in the second direction f2, a shortest distance D1 between the compensation portion 25 and the adjacent first sub-connection line 2401 is greater than a shortest distance D2 between two adjacent first sub-connection lines 2401. In this way, arrangement space of the compensation portion 25 is large.

Figure 21:
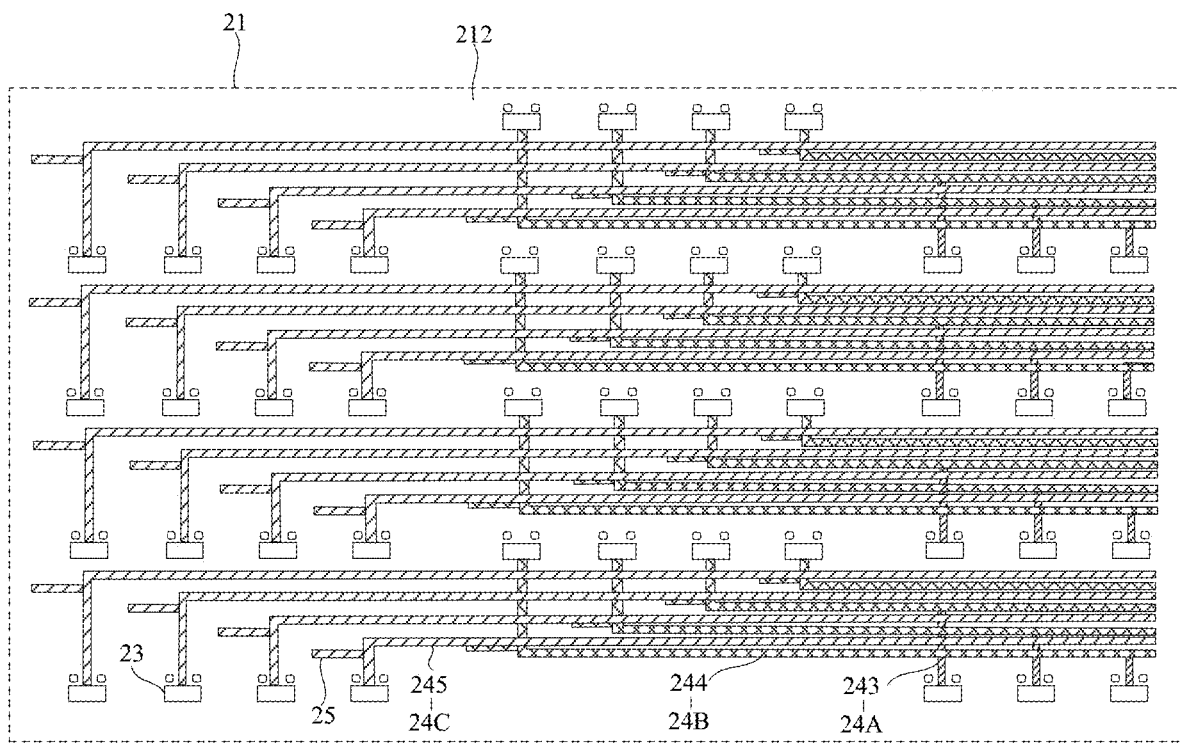
FIG. 21 is a structural schematic diagram of a three-layers wiring according to some embodiments of the present disclosure.
Figure 22:
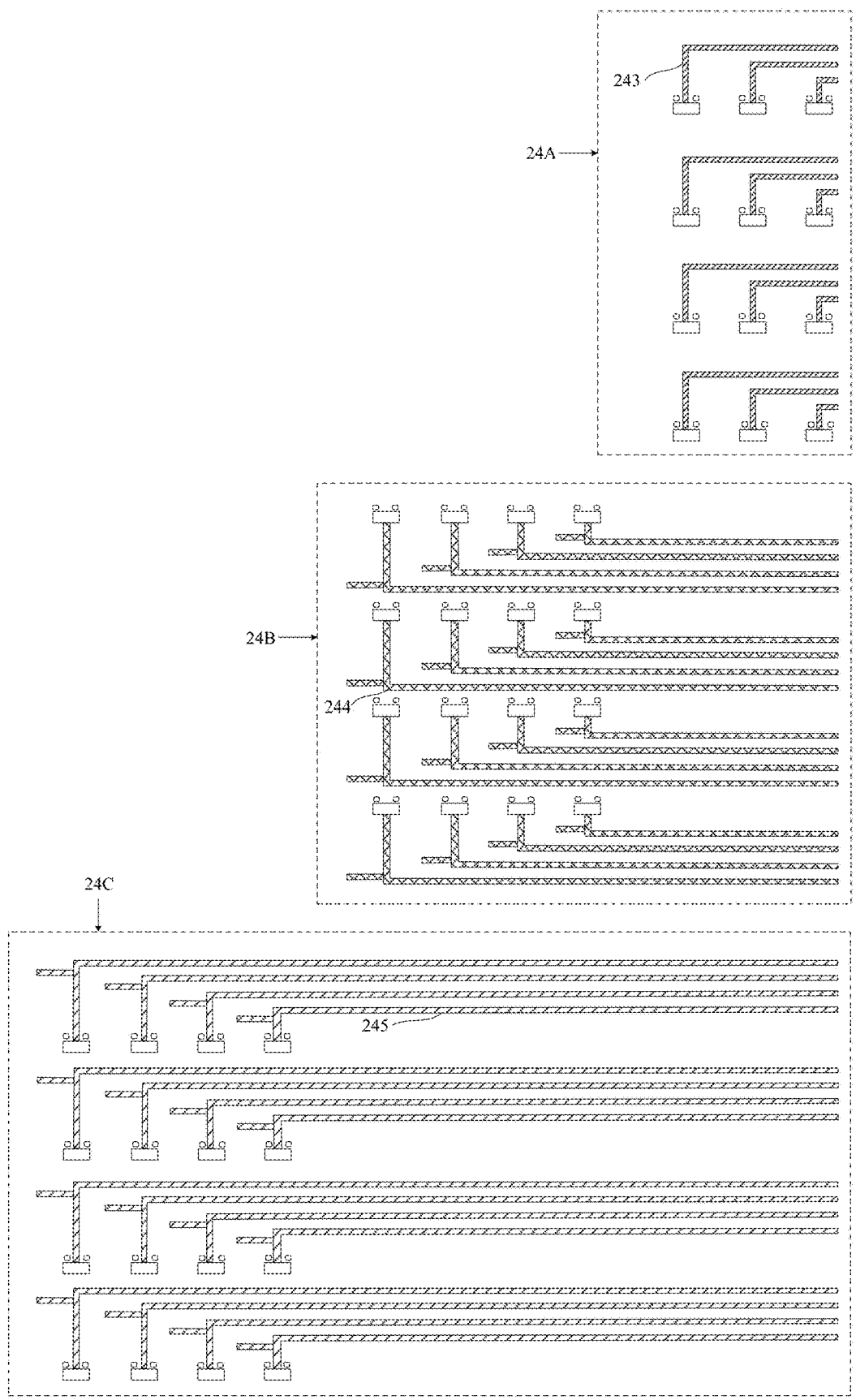
FIG. 22 is a hierarchical structural schematic diagram of the three-layers wiring shown in FIG. 21.

As shown in FIG. 21 and FIG. 22, FIG. 21 is a structural schematic diagram of another three-layers wiring according to some embodiments of the present disclosure, and FIG. 22 is a hierarchical structural schematic diagram of the three-layers wiring shown in FIG. 21. The plurality of connection lines 24 include a plurality of third connection lines 243 disposed in the first structural layer 24A, and the plurality of third connection lines 243 are not connected to the compensation portion 25.

The plurality of connection lines 24 further include a plurality of fourth connection lines 244 disposed in the second structural layer 24B, at least a portion of the plurality of fourth connection lines 244 are connected to the compensation portion 25.

The plurality of connection lines 24 further include a plurality of fifth connection lines 245 disposed in the third structural layer 24C, and the plurality of fifth connection lines 245 are connected to the compensation portion 25.

An orthographic projection of at least a portion of the third connection line 243 extending along the first direction f1 onto the substrate 21 is at least partially overlapped with an orthographic projection of at least a portion of the fourth connection line 244 extending along the first direction f1 onto the substrate 21. The orthographic projection of at least a portion of the fourth connection line 244 extending along the first direction f1 onto the substrate 21 is not overlapped with an orthographic projection of at least a portion of the fifth connection line 245 extending along the first direction f1 onto the substrate 21.

Lengths of both the third connection line 243 and the fourth connection line 244 are less than the length of the fifth connection line 245. Therefore, the third connection line 243 is at least partially overlapped with the fourth connection line 244 in the direction perpendicular to the substrate 21, which increases parasitic capacitances on the third connection line 243 and the fourth connection line 244, such that a difference between the parasitic capacitances on the third connection line 243 and the fourth connection line 244 and a parasitic capacitance on the fifth connection line 245 is small, thereby improving the uniformity of the light-emitting elements in the light-transmissive display region corresponding to the three-layers connection line.

Figure 23:
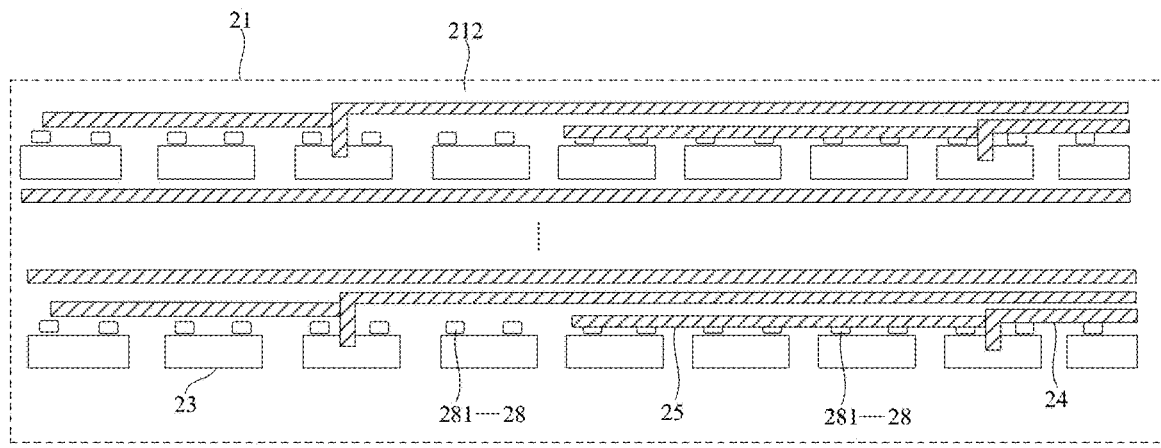
FIG. 23 is a structural schematic diagram of a compensation portion according to some embodiments of the present disclosure.

As shown in FIG. 23, FIG. 23 is a structural schematic diagram of still another compensation portion according to some embodiments of the present disclosure. The display panel further includes a planarization layer 28, and the planarization layer 28 is provided with a plurality of planarization layer via holes 281. The orthographic projection of the compensation portion 25 onto the substrate 21 is at least partially overlapped with an orthographic projection of at least one of the plurality of planarization layer via holes 281 onto the substrate 21.

Figure 24:
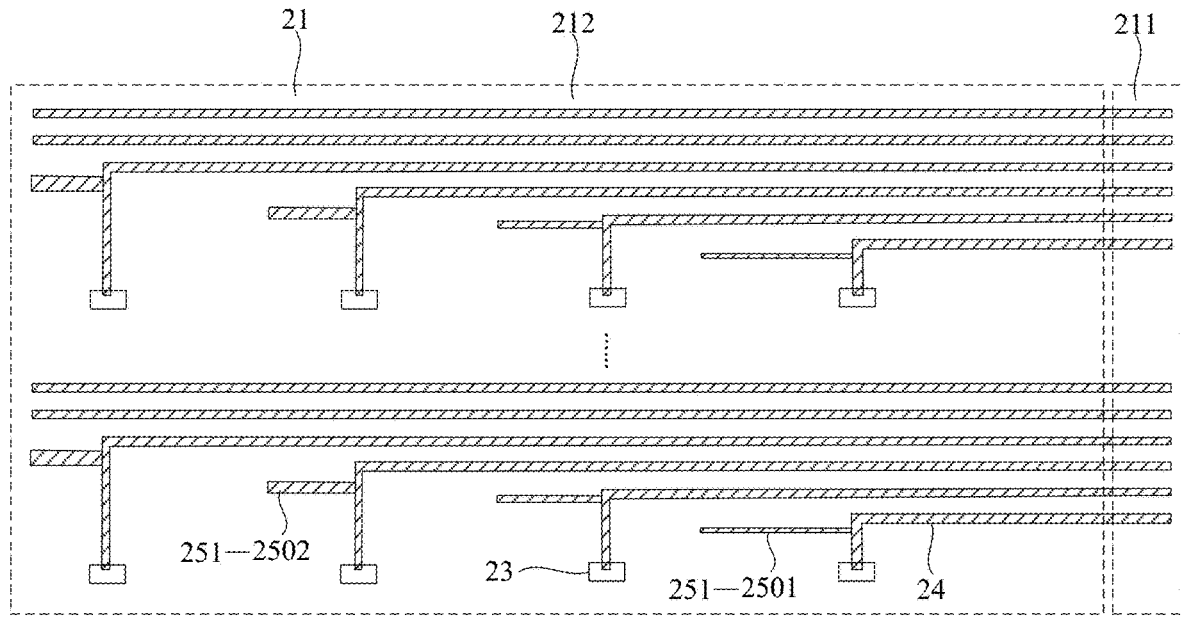
FIG. 24 is a structural schematic diagram of a compensation portion according to some embodiments of the present disclosure.

As shown in FIG. 24, FIG. 24 is a structural schematic diagram of still another compensation portion according to some embodiments of the present disclosure. The linear compensation portion 251 includes a first linear compensation portion 2501 and a second linear compensation portion 2502. The first linear compensation portion 2501 is disposed on a side, proximal to the center of the light-transmissive display region 211, of the second linear compensation portion 2502. The width of the first linear compensation portion 2502 is smaller than the width of the second linear compensation portion 2502.

Further, among the plurality of compensation portions 25 disposed in the conventional display region 212, the width of the compensation portion 25 is positively correlated with the shortest distance between the compensation portion 25 and the center of the light-transmissive display region 211, and the length of the compensation portion 25 is negatively correlated with the shortest distance between the compensation portion 25 and the center of the light-transmissive display region 211. That is, the width of the portion of the compensation portion 25 closer to the light-transmissive display region 211 is smaller, and the length of that is longer, which is due to the fact that the number of connection lines 24 closer to the light-transmissive display region 211 is greater, such that the density of connection lines 24 arranged per unit area is greater, and the distance between adjacent connection lines 24 is smaller, and therefore, the space for arranging the compensation portion 25 is smaller. The width of the compensation portion 25 is narrow, and thus the compensation portion is avoided short circuits with other connection lines 24.

Figure 25:
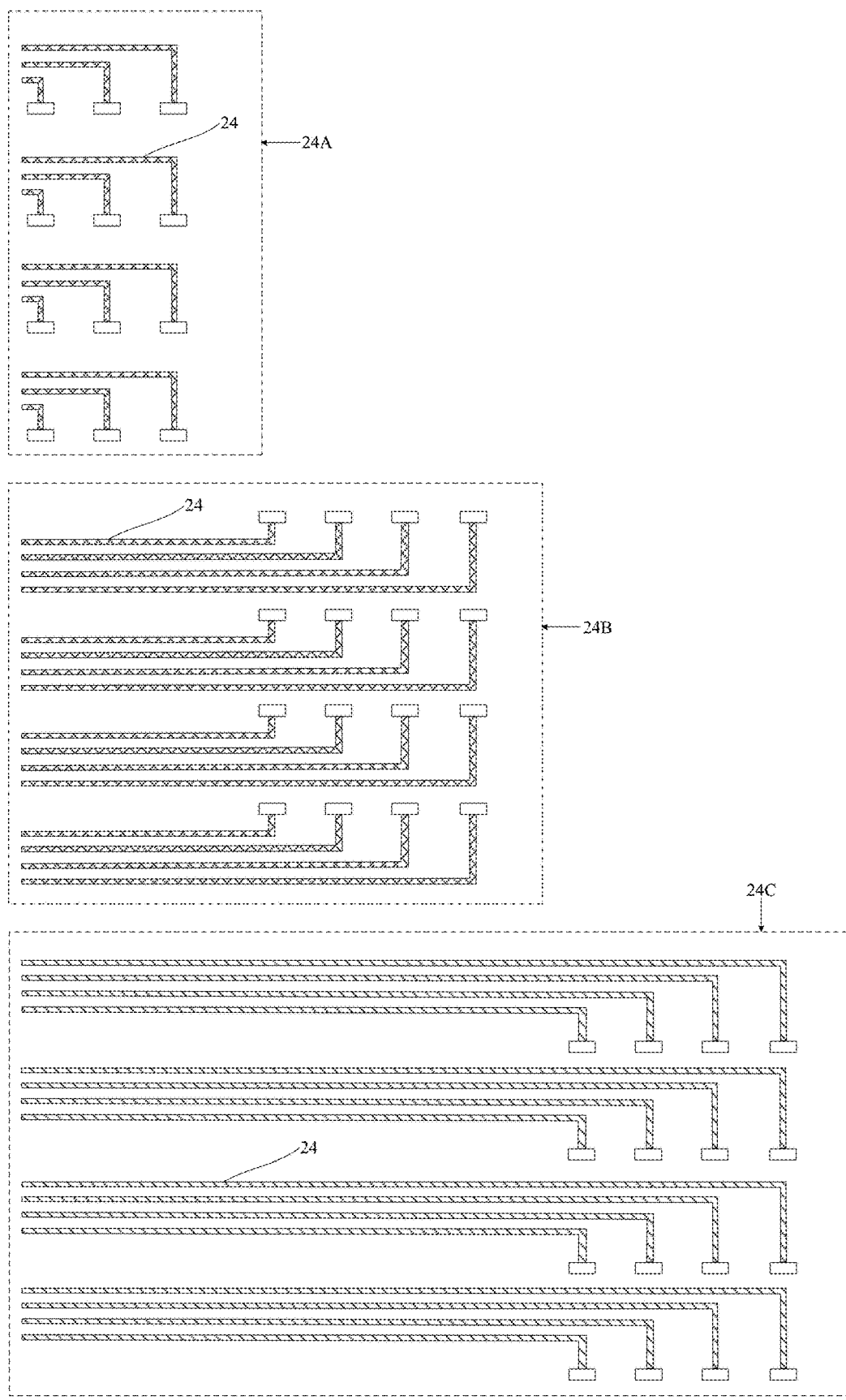
FIG. 25 is a structural schematic diagram of a three-layers wiring according to some embodiments of the present disclosure.

As shown in FIG. 25, FIG. 25 is a structural schematic diagram of still another three-layers wiring according to some embodiments of the present disclosure. The schematic diagram of the wiring structure shown in FIG. 24 is a schematic diagram of a wiring structure of the connection lines 24 disposed on the right side of the symmetry axis S1 in the light-transmissive display region 211 in the schematic diagram of the connection wiring between the light-transmissive display region and the conventional display region of the display panel shown in FIG. 13. The connection lines 24 disposed on the right side of the symmetry axis S1 are not connected to the compensation portion 25. The plurality of connection lines 24 are disposed in the first structural layer 24A, the second structural layer 24B, and third structural layer 24C. The first structural layer 24A, the second structural layer 24B, and the third structural layer 24C are different film layers in the display panel.

Optionally, the pixel drive circuit 23 includes a plurality of thin-film transistors. The thin-film transistor includes a source electrode and a drain electrode. The metal connection line 245 is disposed in the same layer as the source electrode and the drain electrode of the thin-film transistor. The metal connection line 245, the source electrode and the drain electrode are prepared by a one-time patterning process, thereby simplifying the preparation steps of the display panel 20.

Figure 26:
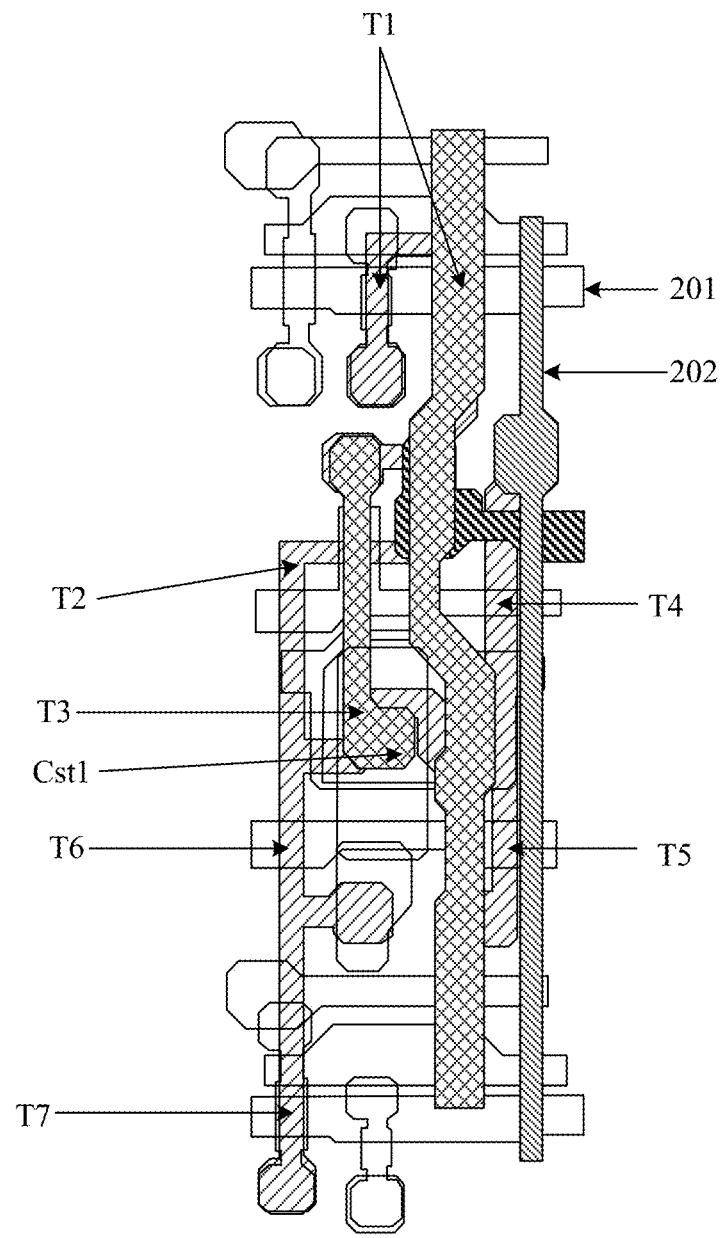
FIG. 26 is a structural schematic diagram of a pixel drive circuit according to some embodiments of the present disclosure.
Figure 27:
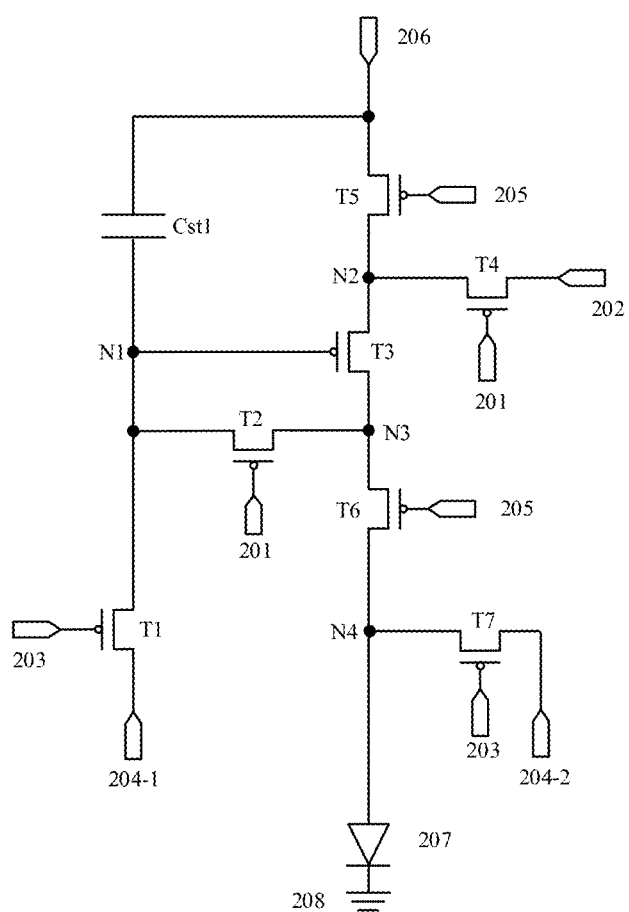
FIG. 27 is a structural schematic diagram of a pixel drive circuit according to some embodiments of the present disclosure.

Referring to FIG. 26 and FIG. 27, in some exemplary embodiments, FIG. 26 is a structural schematic diagram of a pixel drive circuit according to some embodiments of the present disclosure. The pixel drive circuit includes a first thin-film transistor T1, a second thin-film transistor T2, a third thin-film transistor T3, a fourth thin-film transistor T4, a fifth thin-film transistor T5, a sixth thin-film transistor T6, a seventh thin-film transistor T7, and a capacitor structure Cst1.

The first thin-film transistor T1 is the first initial thin-film transistor, the second thin-film transistor T2 is a compensation thin-film transistor, the third thin-film transistor T3 is a drive thin-film transistor, the fourth thin-film transistor T4 is a data writing transistor, the fifth thin-film transistor T5 is an operation control thin-film transistor, the sixth thin-film transistor T6 is an emission control thin-film transistor, and the seventh thin-film transistor T7 is a second initial thin-film transistor. It should be noted that, T1 to T7 include a low temperature poly-silicon (LTPS) thin-film transistor and/or an oxide thin-film transistor (O-TFT). T1 to T7 are other types of thin-film transistors, which are not limited herein.

As shown in FIG. 27, FIG. 27 is a structural schematic diagram of another pixel drive circuit according to some embodiments of the present disclosure. A gate electrode of the third thin-film transistor T3 is connected to a first node N1, a source electrode of the third thin-film transistor T3 is connected to a second node N2, a drain electrode of the third thin-film transistor T3 is connected to a third node N3, and a drain electrode of the sixth thin-film transistor T6 is connected to a fourth node N4.

A gate electrode of the fourth thin-film transistor T4 is connected to a gate line (Gate) 201, a source electrode of the fourth thin-film transistor T4 is connected to a data signal line (Data) 202, and a drain electrode of the fourth thin-film transistor T4 is connected to the second node point N2.

A gate electrode of the second thin-film transistor T2 is connected to the gate line 201, a source electrode of the second thin-film transistor T2 is connected to the third node N3, and a drain electrode of the second thin-film transistor T2 is connected to the first node N1.

Agate electrode of the first thin-film transistor T1 is connected to a reset signal line (Reset) 203, a drain electrode of the first thin-film transistor T1 is connected to a first reference signal line (Vinit) 204-1, and a source electrode of the first thin-film transistor T1 is connected to the first node N1.

A gate electrode of the fifth thin-film transistor T5 and a gate electrode of the sixth thin-film transistor T6 are connected to a light-emitting signal line (EM) 205, a source electrode of the fifth thin-film transistor T5 is connected to a constant voltage high potential (VDD) 206, a drain electrode of the fifth thin-film transistor T5 is connected to the second node N2, a source electrode of the sixth thin-film transistor T6 is connected to the third node N3, the drain electrode of the sixth thin-film transistor T6 is connected to an anode of a light-emitting element (OLED) 207, and a cathode of the light-emitting element 207 is connected to a low potential (VSS) 208.

A gate electrode of the seventh thin-film transistor T7 is connected to the gate line 201, a drain electrode of the seventh thin-film transistor T7 is connected to a second reference signal line 204-2, and a source electrode of the seventh thin-film transistor T7 is connected to the anode of the light-emitting element 207.

One terminal of the capacitor structure Cst1 is connected to the first node N1, and the other terminal of the capacitor structure Cst1 is connected to the constant voltage high potential 206.

The voltage value of the first reference signal line 204-1 is different from the voltage value of the second reference signal line 204-2. Exemplarily, the voltage values of the first reference signal line 204-1 and the second reference signal line 204-2 differ by 1 V to 5V.

Alternatively, the first reference signal line 204-1 and the second reference signal line 204-2 are connected to a same signal input terminal.

It should be noted that, in the present disclosure, in the case that a transistor with opposite polarities is used or a direction of a current changes during a circuit operation, functions of the "source electrode" and the "drain electrode" are occasionally interchanged. Therefore, in the present disclosure, the "source electrode" and the "drain electrode" are interchangeable, which is not limited herein.

Optionally, as shown in FIG. 19, the display panel 20 further includes: a plurality of conventional pixel drive circuits 26 and a plurality of conventional light-emitting elements 27 that are disposed in the conventional display region 212. The plurality of conventional pixel drive circuits 26 and the plurality of conventional light-emitting elements 27 that are disposed in the conventional display region 212 are electrically connected in one-to-one correspondence.

An arrangement density of the plurality of conventional light-emitting elements 27 disposed in the conventional display region 212 is the same as an arrangement density of the plurality of light-emitting elements 22 disposed in the light-transmissive display region 211.

Optionally, the display panel further includes a plurality of virtual pixel circuits disposed in the conventional display region. At least one of the virtual pixel circuits extends along the first direction and is disposed on a side, distal from the light-transmissive display region, of at least one of the pixel drive circuits. The structure of the virtual pixel circuit is similar to the structure of the pixel drive circuit, and the virtual pixel circuit is not connected to both the first light-emitting element and the second light-emitting element of the display panel.

Optionally, the first light-emitting element 221 includes a green light-emitting element, and at least two second light-emitting elements 222 include a blue light-emitting element and a red light-emitting element. A start time of the green light-emitting element is long, and start times of the blue light-emitting element and the red light-emitting element are consistent. Therefore, the length of the connection line 24 electrically connected to the green light-emitting element is less than lengths of the connection lines electrically connected to both the blue light-emitting element and the red light-emitting element.

In some optional embodiments, the compensation portion 25 is electrically connected to the connection line 23 electrically connected to at least a portion of the blue light-emitting elements and the red light-emitting elements. Due to different sizes of different types of light-emitting elements 22 and different connection positions of different light-emitting elements 22 with the connection lines, distances between connection positions of two adjacent light-emitting elements 22 in a light-emitting element group 22a are different, such that differences between the connection lines corresponding to the first pixel drive circuit and the second pixel drive circuit connected to different types of light-emitting elements are different. Exemplarily, the light-transmissive display region 211 includes a row of light-emitting elements 22, the row of light-emitting elements 22 includes a plurality of light-emitting element groups, and one of the light-emitting element groups are arranged in an order of: a red light-emitting element, a green light-emitting element, a blue light-emitting element, and a green light-emitting element. A difference between lengths of the first connection line and the second connection line that are electrically connected to the green light-emitting element ranges from 10 microns to 12 microns. Because the difference is small, the connection lines is not connected to the compensation portion, such that the preparation process of the display panel 20 is simplified.

The difference between lengths of the first connection line and the second connection line that are connected to the red light-emitting element or the blue light-emitting element ranges from 50 microns to 70 microns. Because the difference is large, the connection lines are electrically connected to the first pixel drive circuit by the compensation portion, such that a difference between the capacitance of the first connection line electrically connected to the first pixel drive circuit and the capacitance of the second connection line electrically connected to the second pixel drive circuit is small, thereby improving the display uniformity of the light-transmissive display region.

In summary, some embodiments of the present disclosure provide a display panel, including the plurality of pixel drive circuits, the plurality of connection lines, and the plurality of compensation portions. The length of the first connection line electrically connected to the first pixel drive circuit is less than the length of the second connection line electrically connected to the second pixel drive circuit. The capacitance of the first connection line is compensated by electrically connecting the compensation portion to the first connection line, thereby reducing the difference between the capacitance of the first connection line and the capacitance of the second connection line. In this way, a difference between the start time of the light-emitting element electrically connected to the first pixel drive circuit and the start time of the light-emitting element electrically connected to the second pixel drive circuit is small, such that the display uniformity of the light-transmissive display region is improved.

Some embodiments of the present disclosure further provide a display device. The display device is: a smart phone, a tablet computer, a television, a display, a laptop computer, a digital photo frame, a navigator, or any other product or component with a display function.

The display device includes: a photo-sensitive sensor and the display panel as described above. The photo-sensitive sensor is an image sensor in a camera, a light sensor, or a distance sensor. The image sensor is used for face recognition or fingerprint recognition. An orthographic projection of an incident surface of the photo-sensitive sensor on a substrate of the display panel is within a light-transmissive display region.

It should be pointed out that in the accompanying drawings, the sizes of layers and regions may be exaggerated for clearer illustration. It should be understood that in the case that an element or layer is referred to as being "on" another element or layer, it may be directly on another element, or intervening layers may be present. In addition, it should be understood that in the case that an element or layer is referred to as being "under" another element or layer, the layer may be directly under the other element, or there may be more than one intervening layer or element. In addition, it can further be understood that in the case that a layer or element is referred to as being "between" two layers or two elements, the layer may be the only layer between the two layers or two elements, or more than one intervening layer or element may also be present. Similar reference numerals indicate similar elements throughout.

In the present disclosure, the terms "first", "second", "third", "fourth", "fifth", "sixth", and "seventh" are only used for descriptive purposes, and cannot be understood as indicating or implying relative importance. The term "a plurality of" refers to two or more, unless expressly defined otherwise.

Described above are merely exemplary embodiments of the present disclosure, and are not intended to limit the present disclosure. Therefore, any modifications, equivalent substitutions, improvements, and the like made within the spirit and principles of the present disclosure shall be included in the protection scope of the present disclosure.

What is claimed is:

1. A display panel, comprising:
   a substrate, comprising a light-transmissive display region and a conventional display region surrounding the light-transmissive display region;
   a plurality of light-emitting elements disposed in the light-transmissive display region, a plurality of pixel drive circuits disposed in the conventional display region, and a plurality of connection lines and a plurality of compensation portions that are disposed on the substrate; wherein
   the plurality of light-emitting elements are arranged along a first direction; and
   the plurality of pixel drive circuits are electrically connected to the plurality of light-emitting elements and at least comprise a first pixel drive circuit and a second pixel drive circuit, wherein the first pixel drive circuit and the second pixel drive circuit are respectively disposed on two sides of the light-transmissive display region in the first direction and are respectively electrically connected to the plurality of light-emitting elements by the connection lines, the connection lines comprising a first connection line and a second connection line, a length of the first connection line electrically connected to the first pixel drive circuit being less than a length of the second connection line electrically connected to the second pixel drive circuit, the compensation portion being electrically connected to the first connection line, and the first connection line and the second connection line being two connection lines in the plurality of connection lines.

2. The display panel according to claim 1, wherein the plurality of pixel drive circuits comprise a plurality of columns of pixel drive circuits arranged on the substrate along the first direction, wherein one column of the pixel drive circuits comprises a plurality of the pixel drive circuits arranged along a second direction, an included angle between the second direction and the first direction being greater than 0 degree and less than or equal to 90 degrees; and the first pixel drive circuit is disposed in an $n^{th}$ column of the pixel drive circuits disposed on a first side of the light-transmissive display region, and the second pixel drive circuit is disposed in an $n^{th}$ column of the pixel drive circuits disposed on a second side of the light-transmissive display region, wherein the first side and the second side are the two sides of the light-transmissive display region in the first direction, n is an integer being greater than or equal to 1.

3. The display panel according to claim 1, wherein the compensation portion comprises a linear compensation portion, the linear compensation portion being disposed in the conventional display region.

4. The display panel according to claim 3, wherein the linear compensation portion comprises a first linear compensation portion and a second linear compensation portion, the first linear compensation portion being disposed on a side, proximal to a center of the light-transmissive display region, of the second linear compensation portion, and a width of the first linear compensation portion being less than a width of the second linear compensation portion.

5. The display panel according to claim 1, wherein the compensation portion comprises a block compensation portion disposed in the conventional display region.

6. The display panel according to claim 1, wherein the compensation portion comprises a linear compensation portion and a block compensation portion, the linear compensation portion and the block compensation portion being disposed in the conventional display region.

7. The display panel according to claim 6, wherein one end of the linear compensation portion is connected to the first connection line, and another end of the linear compensation portion is connected to the block compensation portion.

8. The display panel according to claim 1, wherein the connection line and the compensation portion are disposed in a same layer.

9. The display panel according to claim 1, wherein the compensation portion is disposed on an end, distal from the light-transmissive display region, of the first connection line.

10. The display panel according to claim 1, wherein the plurality of connection lines comprise a third connection line and a fourth connection line, the third connection line and the fourth connection line being disposed in different layers; wherein the third connection line is connected to the compensation portion, an orthographic projection of the fourth connection line onto the substrate being at least partially overlapped with an orthographic projection of the compensation portion connected to the third connection line onto the substrate.

11. The display panel according to claim 1, wherein the plurality of connection lines comprise a third connection line and a fourth connection line, the third connection line and the fourth connection line being disposed in different layers; wherein the third connection line is connected to the compensation portion, an orthographic projection of the fourth connection line onto the substrate being staggered from an orthographic projection of the compensation portion connected to the third connection line onto the substrate.

12. The display panel according to claim 1, wherein the connection lines comprise a first sub-connection line and a second sub-connection line that are electrically connected, an end of the first sub-connection line being electrically connected to the light-emitting element, another end of the first sub-connection line being electrically connected to an end of the second sub-connection line, and another end of the second sub-connection line being electrically connected to the pixel drive circuit; wherein the first sub-connection line extends along the first direction, a plurality of the first sub-connection lines are arranged along a second direction, the compensation portion is connected to the second sub-connection line, and the compensation portion and the first sub-connection line are successively arranged along the second direction, an included angle between the second direction and the first direction being greater than 0 degree and less than or equal to 90 degrees.

13. The display panel according to claim 1, wherein the display panel further comprises a planarization layer provided with a plurality of planarization layer via holes; wherein an orthographic projection of the compensation portion onto the substrate is at least partially overlapped with an orthographic projection of at least one of the plurality of planarization layer via holes onto the substrate.

14. The display panel according to claim 1, wherein an absolute value of a difference between a sum of a capacitance of the compensation portion and a capacitance of the first connection line and a capacitance of the second connection line is less than a preset value.

15. The display panel according to claim 1, wherein the plurality of light-emitting elements comprise at least one row of light-emitting elements, the one row of the light-emitting elements comprising a plurality of light-emitting element groups, and the first direction being parallel to a row direction of the one row of the light-emitting elements.

16. The display panel according to claim 15, wherein the plurality of light-emitting element groups comprise at least two first light-emitting elements and at least two second light-emitting elements; and in the plurality of light-emitting element groups in the one row of the light-emitting elements, the pixel drive circuit electrically connected to the first light-emitting element is disposed on a side, proximal to the light-transmissive display region, of the pixel drive circuit electrically connected to the second light-emitting element.

17. The display panel according to claim 16, wherein the first light-emitting element and the second light-emitting element are alternately arranged in the first direction.

18. The display panel according to claim 16, wherein the plurality of light-emitting element groups comprise a first light-emitting element group and a second light-emitting element group, the plurality of first connection lines being electrically connected to a plurality of light-emitting elements in the first light-emitting element group and a plurality of the first pixel drive circuits, and the plurality of second connection lines being electrically connected to a plurality of light-emitting elements in the second light-emitting element group and a plurality of the second pixel drive circuits;
- a length of the first connection line is less than a length of the second connection line, and the compensation portion is connected to at least a portion of the first connection lines; and
- the first light-emitting element group comprises a first-color light-emitting element, a second-color light-emitting element, and a third-color light-emitting element, at least a portion of the connection lines electrically connected to the first-color light-emitting element and the second-color light-emitting element being connected to the compensation portion.

19. The display panel according to claim 1, wherein the light-transmissive display region comprises two light-transmissive sub-regions arranged along the first direction, the light-emitting element within any light-transmission sub-region in the two light-transmissive sub-regions being electrically connected to the pixel drive circuit in the conventional display region adjacent to the light-transmission sub-region.

20. A display device, comprising a photo-sensitive sensor and a display panel, wherein the display panel comprises:
- a substrate, comprising a light-transmissive display region and a conventional display region surrounding the light-transmissive display region;
- a plurality of light-emitting elements disposed in the light-transmissive display region, a plurality of pixel drive circuits disposed in the conventional display region, and a plurality of connection lines and a plurality of compensation portions that are disposed on the substrate; wherein
- the plurality of light-emitting elements are arranged along a first direction; and
- the plurality of pixel drive circuits are electrically connected to the plurality of light-emitting elements and at least comprise a first pixel drive circuit and a second pixel drive circuit, wherein the first pixel drive circuit and the second pixel drive circuit are respectively disposed on two sides of the light-transmissive display region in the first direction and are respectively electrically connected to the plurality of light-emitting elements by the connection lines, the connection lines comprising a first connection line and a second connection line, a length of the first connection line electrically connected to the first pixel drive circuit being less than a length of the second connection line electrically connected to the second pixel drive circuit, the compensation portion being electrically connected to the first connection line, and the first connection line and the second connection line being two connection lines in the plurality of connection lines;
- and an orthographic projection of an incident surface of the photo-sensitive sensor onto the substrate of the display panel falls within the light-transmissive display region.

* * * * *